United States Patent [19]
Li et al.

[11] Patent Number: 5,623,387
[45] Date of Patent: Apr. 22, 1997

[54] ESD PROTECTION CIRCUIT

[75] Inventors: Sheau-Suey Li; Randy T. Ong, both of Cupertino; Samuel Broydo, Los Altos Hills; Khue Duong, San Jose, all of Calif.

[73] Assignee: XILINX, Inc., San Jose, Calif.

[21] Appl. No.: 470,555

[22] Filed: Jun. 5, 1995

Related U.S. Application Data

[62] Division of Ser. No. 58,189, May 3, 1993, Pat. No. 5,477,414.

[51] Int. Cl.$^6$ ............................................. H02H 9/04
[52] U.S. Cl. ............................ 361/56; 361/91; 361/111; 257/355
[58] Field of Search .......................... 257/355; 361/56, 361/58, 91, 111

[56] References Cited

U.S. PATENT DOCUMENTS

| | | | |
|---|---|---|---|
| 4,633,283 | 12/1986 | Avery | 357/23.13 |
| 4,819,047 | 4/1989 | Gilfeather et al. | 361/56 |
| 4,990,802 | 2/1991 | Smooha | 307/482 |
| 5,010,380 | 4/1991 | Avery | 357/23.13 |
| 5,043,782 | 8/1991 | Avery | 357/23.13 |
| 5,051,860 | 9/1991 | Lee et al. | 361/56 |
| 5,139,959 | 8/1992 | Craft et al. | 437/31 |
| 5,223,737 | 6/1993 | Canclini | 257/546 |
| 5,272,097 | 12/1993 | Shiota | 437/34 |
| 5,276,582 | 1/1994 | Merrill et al. | 361/111 |

OTHER PUBLICATIONS

David Sarnoff Research Center, Subsidiary of SRI International; "Electrostatic Discharge Protection"; pp. 1–4; 05/18–11–400–007; Princeton, New Jersey, 1991.

*Primary Examiner*—Howard L. Williams
*Assistant Examiner*—Sally C. Medley
*Attorney, Agent, or Firm*—Edel M. Young; Anthony C. Murabito

[57] ABSTRACT

An ESD protection circuit combines a split bipolar transistor with a transistor layout which exhibits very high tolerance to ESD events. The split bipolar transistor divides current among many segments and prevents the current hogging which often causes an ESD failure. Several splitting structures are disclosed, each combining a resistor in series with each segment to distribute current evenly. The transistor takes advantage of the snap-back effect to increase current carrying capacity. Layout positions metal contacts away from regions of highest energy dissipation. Layout also allows high currents to be dissipated through ESD protection structures and not through circuit devices such as output drivers or through parasitic bipolar transistors not designed for high current. Sharp changes in electron density are avoided by the use of high-diffusing phosphorus in N-regions implanted to both lightly and heavily doped levels. Critical corners are rounded rather than sharp. Certain P-type channel stop implants are positioned away from nearby N-regions to increase breakdown voltage.

5 Claims, 23 Drawing Sheets

VOLTAGE BETWEEN TRANSISTOR
COLLECTOR AND EMITTER

~15V

VOLTAGE ACROSS TRANSISTOR
AND SERIES RESISTOR

ESD PROTECTION CIRCUIT

This application is a division of application Ser. No. 08/058,189, filed May 3, 1993 now U.S. Pat. No. 5,477,414.

FIELD OF THE INVENTION

The present invention relates to protection of integrated circuit devices from electrostatic discharge (ESD), and in particular to circuit structures and layout of these circuit structures for improved ESD protection.

BACKGROUND OF THE INVENTION

For many years, integrated circuit devices have included on-chip circuits for ESD protection. In the past, ESD protection was provided without a theoretical understanding of the physics underlying the ESD event. More recently, ESD events have become better understood, and therefore circuits for ESD protection have become more effective. However, as integrated circuit devices become smaller, their tolerance of ESD or other high voltage events becomes less, and the need for protection circuitry is increased.

Models

Several models for the magnitude, duration, rise time and other characteristics of an ESD event have been devised. These models are frequently used to specify what kind of ESD event must be tolerated by an integrated circuit device. A human body model based on a sitting person holding a pointed metal object making contact with an integrated circuit device, assumes that the human has capacitance of 100–250 pF, resistance of 1000–2000 ohms, and inductance of 50–100 nH. Thus, rise time of the ESD voltage is on the order of a few nanoseconds and the event lasts a few hundred nanoseconds. A more severe charged-device model assumes a very rapid, high-current, fast rise time ESD and no series resistance from a human body. A machine model consists of a 200 pF capacitor which discharges directly into the component.

It is desirable that an integrated circuit device be able to withstand any ESD it may encounter, so preferably the device should withstand an ESD described by any of the models.

The ESD protection circuit must sense the large transient and discharge it before internal circuit components have been damaged or destroyed. In MOS circuits, one sensitive internal structure is the gate oxide. Gate oxide can usually sustain a transient voltage on the order of 15 to 25 volts, depending upon process conditions and, of course, oxide thickness. Other structures besides gate oxide are sensitive as well, and must be protected. For example, output devices will move into snap-back mode when emitter-collector voltage exceeds a certain level. Snap-back mode is a condition in which as emitter-collector voltage increases, a voltage is reached at which current flow increases dramatically, and remains high even if voltage decreases somewhat. If voltage then continues to increase, the high current may produce enough heat to destroy the output device. Thus the ESD protection circuit must begin discharging large current before chip voltage resulting from the ESD event has risen to a damaging level.

An ESD protection circuit should protect the device from an ESD applied between any pair of external pins. Typically several pins will contact Vcc and ground voltage sources. Other pins are intended to receive signals during circuit operation. When the device is being handled by an individual or machine during manufacturing, testing, or installation, the device may experience large voltage spikes between any pair of pins.

FIG. 1 shows components of an ESD protection circuit which detects all major transients and responds to the transients by conducting current before voltage can build up to a damaging level. Points in FIG. 1 which are likely to have contact with exterior voltage sources are signal pads (a pad is a conductive region within the integrated circuit chip to which an external pin is connected) such as pad 101, the VCC rail, and the ground rail, shown as VSS in FIG. 1. The circuit of FIG. 1 protects the internal structure (represented by transistors T1, T2, T3, and T4) against a high voltage difference in either direction between any two of VCC, VSS, and pads such as 101. ESD protection circuits generally need to function when the IC device is not installed or powered up, and thus encounter the condition in which two terminals experience a large voltage difference and other terminals are floating. Seven such conditions are enumerated for the three kinds of terminals:

1. high voltage to pad 101, low voltage to VCC rail,
2. low voltage to pad 101, high voltage to VCC rail,
3. high voltage to pad 101, low voltage to VSS,
4. low voltage to pad 101, high voltage to VSS,
5. high voltage to VSS, low voltage to VCC rail,
6. low voltage to VSS, high voltage to VCC rail, and
7. high voltage to one pad, low voltage to another pad.

Transistors T1 and T2 represent an output device which must be protected from a high voltage difference in either direction between VCC and pad 101 (conditions 1 and 2) or between VSS and pad 101 (conditions 3 and 4). Typically, condition 1 is accounted for by circuit 122 and condition 2 is accommodated by a combination of circuit 121a and circuit 124. The combination of resistor R1 and ESD protection circuit 124 protect transistor T2 from a large voltage difference between pad 101 and VSS (conditions 3 and 4). ESD protection circuits 121a, 121b, etc. protect transistors T1 and T2, as well as internal circuit elements not shown, from a high voltage spike between VCC and VSS (conditions 5 and 6). ESD protection circuits, such as circuits 121a and 121b, are provided at different physical locations around the chip, one repetition being illustrated as 121b.

Transistors T3 and T4 represent an input device which must also be protected from a high voltage difference in either direction between VCC or VSS and pad 101. The gates of input transistors T3 and T4 are protected from a voltage spike between pad 101 and VCC or VSS by a combination of resistor R3 and ESD protection circuits 123 and 125 in combination with circuits 121, 122 and 124. Because of the sensitivity of gate oxides, ESD protection circuits 123 and 125 are preferably further provided in order to assure that a very large voltage spike at pad 101 does not result in a voltage of more than can be withstood at the gates of transistors T3 and T4. Gate oxides in an MOS device typically are able to withstand less voltage than other parts of the device such as the channels between source and drain. This maximum tolerable voltage drop decreases with time and with stress to the gate oxide. Another reason for providing ESD protection circuits is the inherent resistance which occurs even in metal lines which form VCC and VSS. This inherent resistance is illustrated in FIG. 1 by the small resistors present in the VCC and VSS lines. If circuit 125 were provided close to pad 101 and physically far from transistor T4, the voltage drop due to line resistance on VSS could cause too high a voltage drop between line 104 and the source of transistor T4. Thus, ESD protection circuit 125 is preferably provided physically close to transistor T4. The equivalent situation occurs with the VCC line and transistor T3.

A high voltage difference between one signal pad and another signal pad (condition 7) is handled by repetitions of circuits 121, 122, and 124, since each pad in an IC device includes similar protection circuitry to that shown in FIG. 1. Current can flow from the high voltage pad through circuit 122 to the VCC rail and from the VCC rail through another set of circuits 121 and 124 to the low voltage pad.

FIG. 2 shows a prior art implementation of the circuit of FIG. 1. The VCC and VSS rails are typically wide lines having large capacitance (between VCC and VSS) and large current carrying capacity. Circuits such as 121a and 121b, as mentioned above, are typically provided at many physically spaced locations on the VCC and VSS rails. A large diode D124 begins to conduct when VSS is less than 1 volt above the voltage on pad 101. Certain parasitic diodes are inherently formed in a CMOS device because N-wells of P-channel transistors are connected to the VCC rail and P-wells of N-channel transistors are connected to the VSS rail. When a voltage spike occurs with the high voltage end at VSS and low at VCC, the parasitic diodes formed by the P substrate and N-wells of transistors throughout the device will likely clamp the voltage before both of diodes D124 and D122 turn on. However, for extra protection, large diodes D124 and D122 are provided to drain the current so that no excessive voltage build-up occurs. However, for the opposite polarity, pad 101 voltage must be about 15 volts above VSS before diode D124 begins to conduct (break down) in the reverse bias direction. (The actual voltage is process-dependent. The 15-volt number is representative of today's processes.) A similar situation exists with diode D122. Because of the relatively high reverse breakdown voltages, diodes D122 and D124 offer insufficient ESD protection for positive spikes on VCC relative to VSS. Thus circuit 121 is added to dissipate a positive voltage difference between VCC and VSS.

An intrinsic reverse biased diode (the PN junction) between the collector and base of transistor T121 begins to conduct when the collector voltage is sufficiently higher than the base voltage. Current through transistor T121 causes the voltage at the base of bipolar transistor T121 to rise with respect to the emitter voltage, thereby turning on transistor T121. Transistor T121 then conducts current from VCC to VSS, which in turn prevents voltage build-up at the gates of transistors T3 and T4.

If pad voltage is high with respect to VSS, transistor T124 conducts current from the pad to VSS. The circuit is equivalent to that of transistor T121, just discussed.

Segmented Bipolar

For improved protection, transistor T121 may be manufactured as a split bipolar transistor with multiple segments in parallel, separated by walls of field oxide. These walls bias the current to flow parallel to the walls. In this manner, current, and thus heat dissipation, is approximately evenly divided among the segments. This arrangement minimizes hot spots and allows an increase in total energy that can be successfully dissipated.

Snapback and Current Hogging

The high current flow through transistor T121 causes significant heat dissipation at transistor T121, particularly at the collector-base junction of the transistor. Once high current begins to flow, a plasma forms in the collector-emitter path of transistor T121.

FIGS. 3A and 3B show characteristic curves for bipolar transistors illustrating the effect of the snap-back mode. FIG. 3A shows a curve for a transistor alone, while FIG. 3B shows a curve for the combination of a resistor in series with the collector-emitter path of the transistor. As shown in FIG. 3A, the transistor demonstrates high resistance at first, carrying relatively low current in response to an initial voltage rise. As the voltage reaches a level indicated by point A, a plasma is generated, and current rises rapidly even though voltage decreases. Because of the plasma, from point B (which is considered the snap-back point) to point C, current rises sharply in response to a voltage increase. Since the slope of the curve between points B and C is quite steep, any part of the transistor between points B and C exhibits very low resistance. Thus, any segment of the segmented transistor which has moved into snap-back mode tends to pull current laterally from adjacent segments (called current hogging), and prevents other segments from moving into snap-back mode. Current hogging is undesirable, since a current increase higher than indicated at point C may occur. A higher current than indicated at point C results in destruction of the device, (which occurs in region D of the curve) for example, by melting of the silicon or by contact spiking (forming a spike from a metal layer to the silicon. The parallel segments are manufactured to be as much alike as possible so that all segments move into snap-back mode at the same voltage, and current is evenly distributed through the segments. However small variations always occur, thereby causing the segments to move into snap mode at slightly different times.

Current hogging is minimized by using walls to prevent lateral current flow and using a resistor in series with each transistor segment. FIG. 3B shows the effect of adding resistance in series with the segmented transistor. As current through one segment increases with respect to others, the voltage drop across the series resistor increases correspondingly, and the higher voltage causes increased current through other parallel segments, so that all segments move into snap-back mode and all carry approximately the same current. In FIG. 3B, the curve between regions B and C shows a definite ohmic component, with point C being at a higher voltage than point A. The two vertical lines represent a variation in voltage at which the segments move into snap-back mode, line L indicating the lowest voltage at which any of the segments snap-back and line H indicating the highest voltage at which any segments snap-back. As the lowest segment reaches its snap-back voltage, that segment moves to point B and quickly toward point C on the curve. However when the voltage again rises above the snap-back voltages of other segments those segments also move into snap-back mode. Thus all segments move into snap-back mode before any segments move into region D which indicates failure of the chip.

Another feature of the segmented transistor is shown in FIG. 3C. FIG. 3C represents a plan view of a split bipolar transistor having a collector region 305 and an emitter region 307. Beneath field oxide region 306b is the base region. Field oxide regions 306a separate segments such as S1 and S2 from each other. When a high voltage appears on contacts 303, with a low voltage on emitter contacts 309, one of the segments, for example S2, turns on first. Lines 316 represent the direction of current flow from segment S2 of collector 305 to emitter 307. Line 315 represents an equipotential line resulting from this current flow. Thus current flow in segment S2 causes an increased voltage drop between base and emitter of adjacent segments S1 and S3, biasing these adjacent segments to turn on and spread current. Thus two mechanisms, the field bias and the resistance discussed in connection with FIG. 3B, both mitigate in favor of dividing current among many segments and against current hogging in a single segment. Each segment which is carrying high current biases the next adjacent segment to turning on, so that in response to a large ESD event, all segments quickly turn on.

Prior art circuits have achieved successful protection against ESD events of 2000–4000 volts (human body model). However, as device sizes and oxide thicknesses decrease, integrated circuit devices become more sensitive to ESD events and protection must be improved. It is desirable to protect an integrated circuit device from higher voltage and more severe ESD events, and it is necessary to be more careful in designing the ESD protection because of the more delicate devices to be protected.

One weakness not previously recognized in ESD protection is the protection of an output driver transistor from a negative pad Voltage with respect to the positive or negative power supply rails. Compared to other components of an integrated circuit, output driver transistors, which are typically large, and which might actually comprise parallel transistors, are able to withstand considerable current flow. However, under a high voltage ESD event, even the output driver transistors must be protected. In a typical CMOS circuit, the output driver comprises a P-channel pull-up transistor and an N-channel pull-down transistor. A natural parasitic bipolar transistor exists in parallel with the N-channel MOS transistor. The base of this bipolar transistor is the well in which the channel is formed. Since the channel region of an N-channel transistor is typically tied to the negative power rail, the base is thus tied to the negative rail. In an ESD event in which the pad is positive and the negative rail experiences a negative voltage, this parasitic transistor will turn on and drain off the necessary current. But no such parasitic bipolar transistor will turn on to prevent excess current through a P-channel pull-up transistor. Thus a high voltage on the positive supply rail and a negative pad voltage can destroy the P-channel pull-up transistor.

SUMMARY OF THE INVENTION

According to the present invention, ESD protection is increased by providing one of the following structures. First, the P-channel pull-up output transistor can be replaced by an N-channel transistor plus an inverter (so the output signal is inverted before driving the N-channel pull-up transistor). This has the advantage of providing the parasitic bipolar transistor during an ESD event in which VCC is high and the pad is low. But it has the disadvantage during normal operation of not pulling the pad output voltage all the way to the positive rail. As a second alternative, the P-channel pull-up output transistor is retained but protected by a split bipolar transistor having its collector connected to the positive rail, its base connected to the negative rail, and its emitter connected to the pad. An ESD event in which the positive rail experiences a positive voltage, the pad experiences a negative voltage and the negative rail is left floating (near zero volts) will turn on this split bipolar transistor and protect the P-channel output driver. As a third alternative, the P-channel pull-up transistor can be retained to provide the rail-to-rail output voltage swing during operation and an N-channel transistor may be provided in parallel with the P-channel transistor to provide the parasitic path during an ESD event.

Also, according to the present invention, components are sized, shaped, and positioned to achieve improved ESD protection. In particular, base-to-emitter resistors in the ESD protection devices are sized and shaped to have higher resistance than base-to-emitter resistance of the parasitic bipolar transistors which exist in parallel with output driver pull-down N-channel MOS transistors. This sizing and shaping prevents the output drivers from going into snap-back mode before the ESD protection device goes into snap-back mode, and thus protects the output drivers from excessive current.

As another feature of the invention, a plurality of ESD protection circuits is combined. The circuits include split bipolar transistors for carrying current from the positive power rail to the negative power rail and split bipolar transistors for carrying current from signal pads to the negative power rail.

The split bipolar transistors are formed as a plurality of adjacent collector regions separated by a base region from a plurality of adjacent emitter regions. Splitting of the bipolar transistors into segments may be accomplished by oxide walls extending in a direction from the collector contacts to the collector-base junction. In another embodiment, some of the collector regions are separated from adjacent collector regions by Zener diodes which extend from the base junction toward a common collector contact region. The Zener diodes serve two functions. In addition to splitting collector regions from each other to present lateral current flow and current hogging, the Zener diodes also cause the split bipolar transistors to turn on at a lower voltage, thus responding to an ESD event more quickly and therefore reducing voltage buildup in the device.

As a further inventive feature, layout of the split bipolar transistors positions the base contact on the opposite side of the emitter from the base, and at least twice as far from the base as is the emitter contact. This results in significant resistance between the base contact and the base. Higher base resistance allows the transistor to turn on in response to a lower voltage, and the base contact is not in danger of overheating during an ESD event since maximum heat is generated in the base region itself, particularly at the base-collector junction.

In addition to these split bipolar transistors the best result comes from additional protection to gates of MOS transistors. A resistor is positioned between a pad and any gate driven by that pad. Thus the gates are partly isolated by this resistor from large excursions in pad voltage. Between the resistor and the gate are ESD protection circuits which turn on at a voltage lower than the gate breakdown voltage to dissipate voltage buildup between the pad and the positive and negative power supply rails. As a feature of the invention, this extra protection includes both an MOS transistor and a Zener diode, thus decreasing the sensitivity of the resulting device to process variations between manufacturers and between lots from the same manufacturer.

For carrying current in a direction opposite to that which occurs during operation, simpler circuits such as diodes formed from intrinsic P-N junctions can provide the necessary current path.

According to another aspect of the invention, diodes which conduct current in a direction opposite to normal operation current flow are formed with segmenting barriers such that current must flow approximately in the length direction from anode to cathode and is prevented or inhibited from flowing laterally from one part of the cathode to the anode. In one embodiment, the segmenting barriers are formed from oxide whereas in another embodiment the segmenting barriers are formed as P-N junctions. Two diodes are typically provided for each pad, one diode for conducting current from voltage source VSS to the pad and another diode for conducting current from the pad to voltage source VCC. And preferably both diodes are segmented.

As yet another feature of the invention also relating to layout of the transistors, the output transistors are laid out so that current flow through them is evenly distributed. In the case of N-channel pullup and pulldown transistors, both are formed as a plurality of parallel segments and each segment is surrounded by a diffusion region which is contacted repeatedly by the VSS line so that all parts of the transistors are surrounded by a region of equal potential. This improves the evenness of current flow from source to drain or drain to source.

Experiments have shown a significant increase in ESD voltage tolerated, to the point that some devices have tolerated ESD voltages from 18,000 volts to 25,000 volts (human body model).

DETAILED DESCRIPTION OF SOME EMBODIMENTS

Figure 4A:
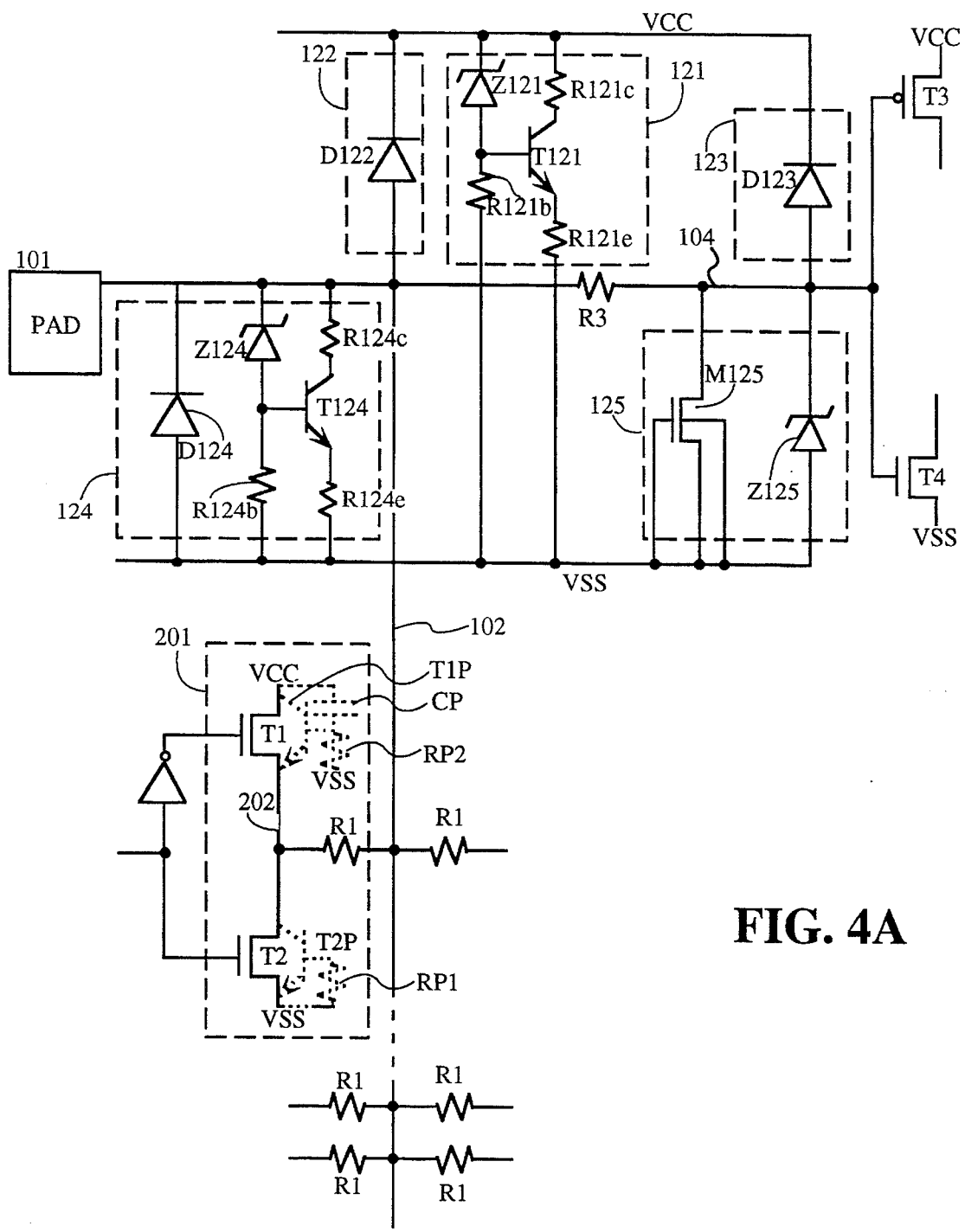
FIG. 4A shows an NMOS output driver circuit according to the present invention which provides improved ESD protection.

FIG. 4A shows an improved ESD protection circuit according to the present invention. This circuit is particularly effective with MOS devices (including CMOS devices). Zener diode Z121 causes transistor T121 to turn on at a voltage lower than caused by its own intrinsic diode. Zener diode Z121 preferably has a breakdown voltage on the order of 8–10 volts, a value higher than the maximum operating voltage of the circuit being protected and substantially lower than voltages at which any circuit components fail. When the VCC voltage becomes greater than the VSS voltage by more than the breakdown voltage of Zener diode Z121, current flows through Zener diode Z121 and resistor R121 from VCC to VSS, raising the voltage at the base of transistor T121, turning it on. The early turn-on provides greater protection of the IC from excessive voltage buildup during an ESD event.

Figure 1:
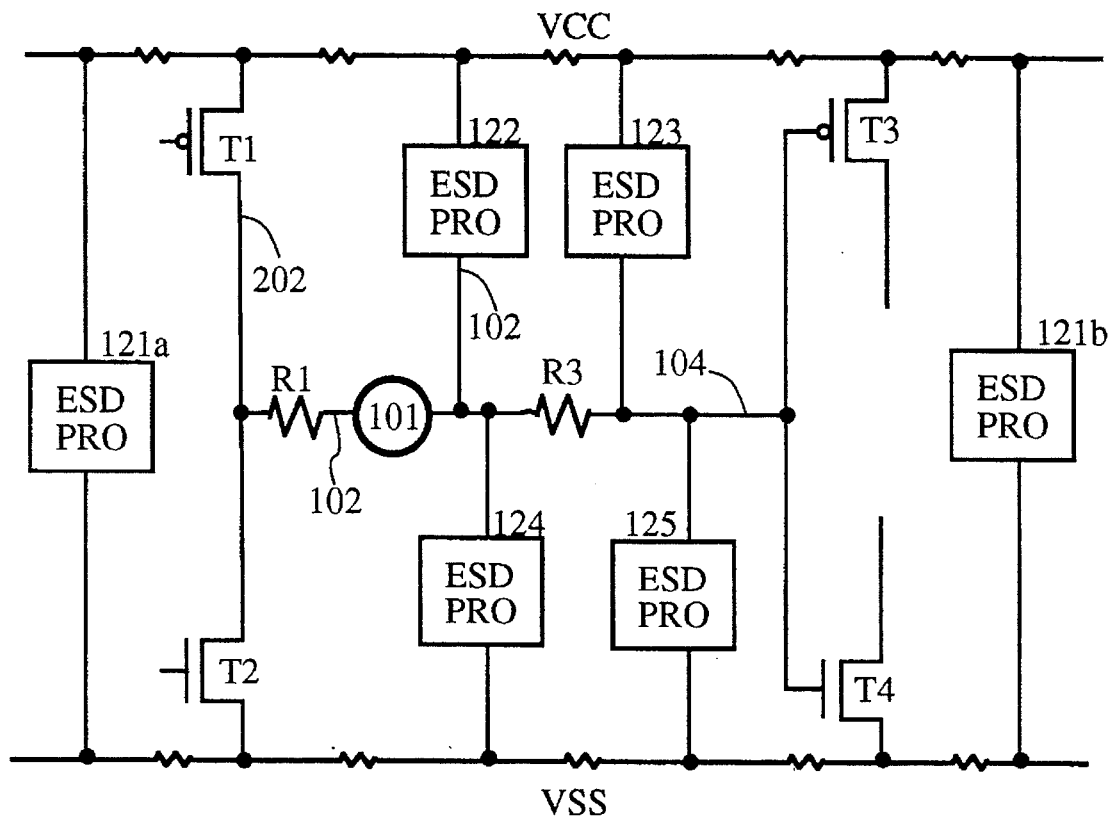
FIG. 1 shows functional components of a prior art ESD protection circuit according to the invention.
Figure 2:
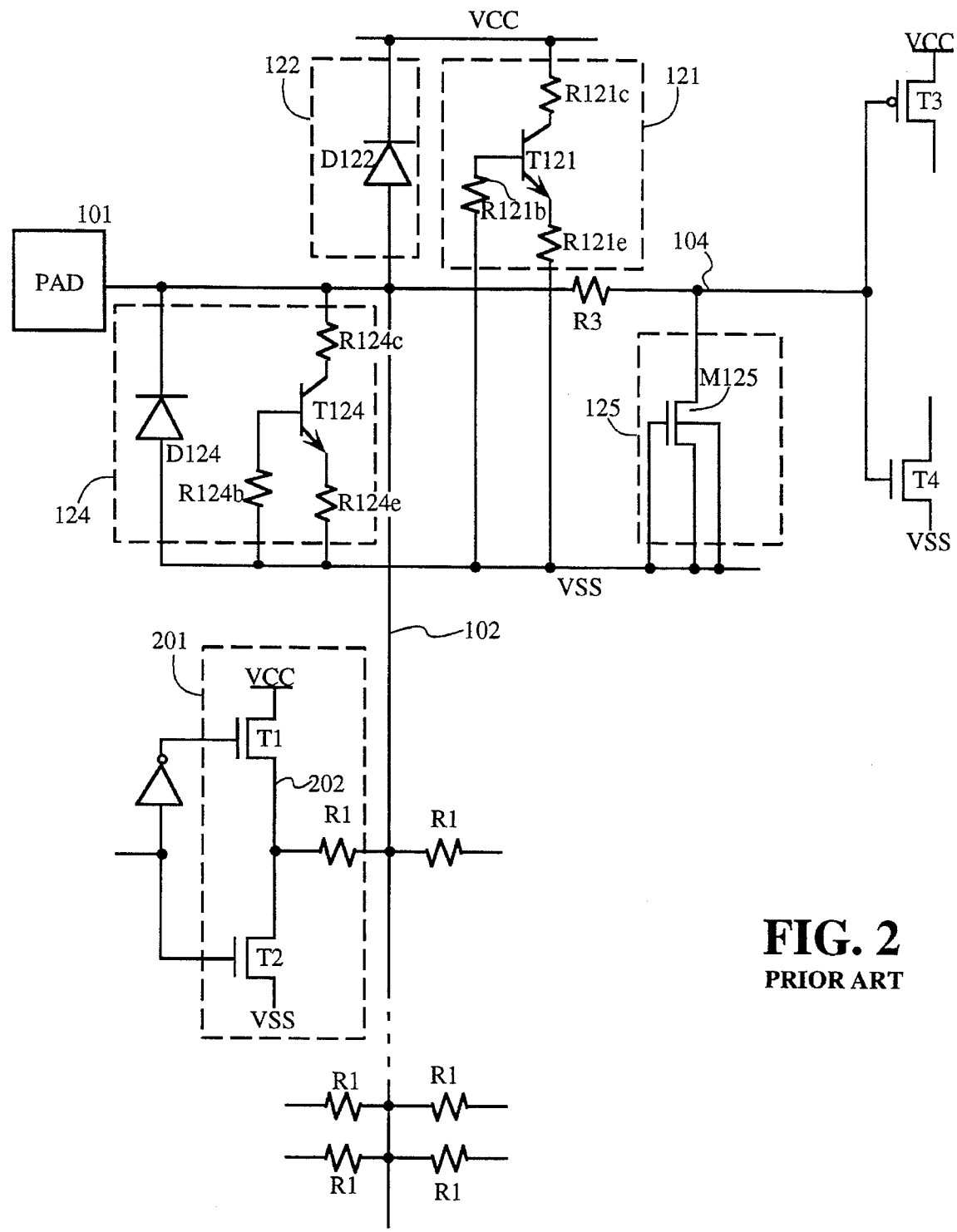
FIG. 2 shows a circuit which provides the components of FIG. 1.

Extra protection for the sensitive gate oxide is also preferably provided. Referring to FIG. 4A, transistors T3 and T4 are driven by pad 101. As in the prior art circuit, an MOS transistor M125 drains charge between pad 101 and ground when voltage exceeds the transistor punch-through voltage, preferably about 10 volts. Resistor R3 separates the gates of input transistors T3 and T4 from pad 101, so transistor M125 provides secondary protection in addition to the primary protection being provided by circuits 121, 122, and 124. As in prior art FIG. 2, transistor M125 protects these gates from a high VSS voltage and low pad voltage. Transistor M125 functions in snap-back mode to drain charge in response to a high pad voltage and low VSS voltage. The snap-back effect clamps the voltage between line 104 and VSS, preferably at around 10–11 volts, so the gate oxides of transistors such as T3 and T4 are protected from breakdown. However, transistor M125 is process-sensitive. A manufacturer may use a process which is not under the complete control of the circuit designer. Thus the breakdown voltage of transistor M125 may not be consistent from one manufacturer to another or from one batch of ICs to another. Therefore, if processing conditions are unfavorable, the gate voltage on transistors T3 and T4 may rise to a level which is sufficient to destroy the gate oxide of transistors T3 and T4. For greater protection, bipolar zener diode Z125 is provided. Using a combination of bipolar and MOS technologies gives more assurance of a breakdown voltage lower than that of the gate oxide under process variations from one lot to another or one manufacturer to another. These diodes M125 and Z125 preferably break down when line 104 voltage is 8–10 volts above VSS. Thus transistor T4 is protected from experiencing an ESD voltage above 8–10 volts.

Further protection for transistor T3 is provided by diode D123, which turns on when the voltage on line 104 is higher than VCC by more than one diode drop (for example 0.7 volts). In another embodiment, diode D123 is a Zener diode, which also turns on when line 104 voltage is one threshold drop (for example 0.7 volts) above VCC, and breaks down at a lower voltage than a standard diode D123, for example when VCC is 8–10 volts above the voltage on line 104. This Zener breakdown value, as before, is selected to be higher than the maximum operating voltage of the IC and lower than the breakdown voltage of the gate oxide. In yet another embodiment, not shown, diode D123 can be replaced by a combination equivalent to Zener diode Z125 and MOS diode M125.

Layout of Circuit 124

As mentioned above, layout of the components of FIG. 4A or of any other ESD protection circuit has a significant effect on tolerance to ESD events. A large ESD event dissipates considerable heat, causing a rise in temperature of the integrated circuit device. It is important that the heat dissipation be spread over a fairly sizable area and that the hottest spots be separated from metal contacts, which have lower melting points than silicon structures.

Figure 4B:
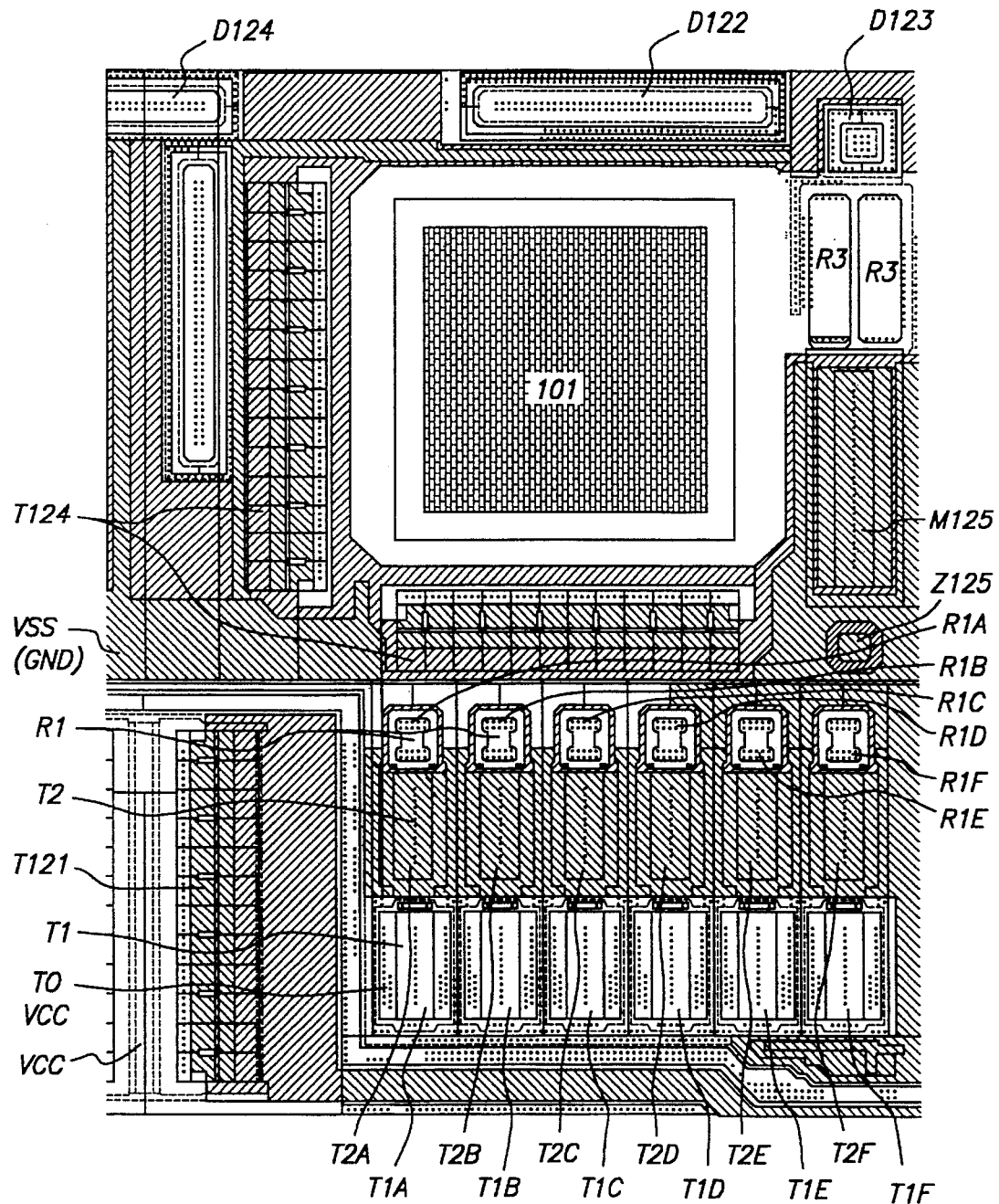
FIG. 4B shows a layout of the circuit of FIG. 4A illustrating relative positions and sizes of the elements.

FIG. 4B shows one layout of the circuit elements of FIG. 4A. Transistor T124 is formed in 26 segments, 14 along one edge of pad 101 and 12 along another edge of pad 101. Output transistor T1 is formed as six transistors T1A through T1F positioned side by side and separated by P-diffusion regions (shown more clearly in FIG. 6A). Likewise, transistor T2 is formed as six transistors T2A through T2F positioned side by side and separated by P-diffusion regions. Transistors T1A through T1F and T2A through T2F are connected through corresponding resistors R1A through R1F to pad 101. These parallel resistors R1A through R1F limit current through transistors T1 and T2, and also cause current to divide evenly among the segments T1A through T1F and T2A through T2F.

Split Bipolar

Figure 5A:
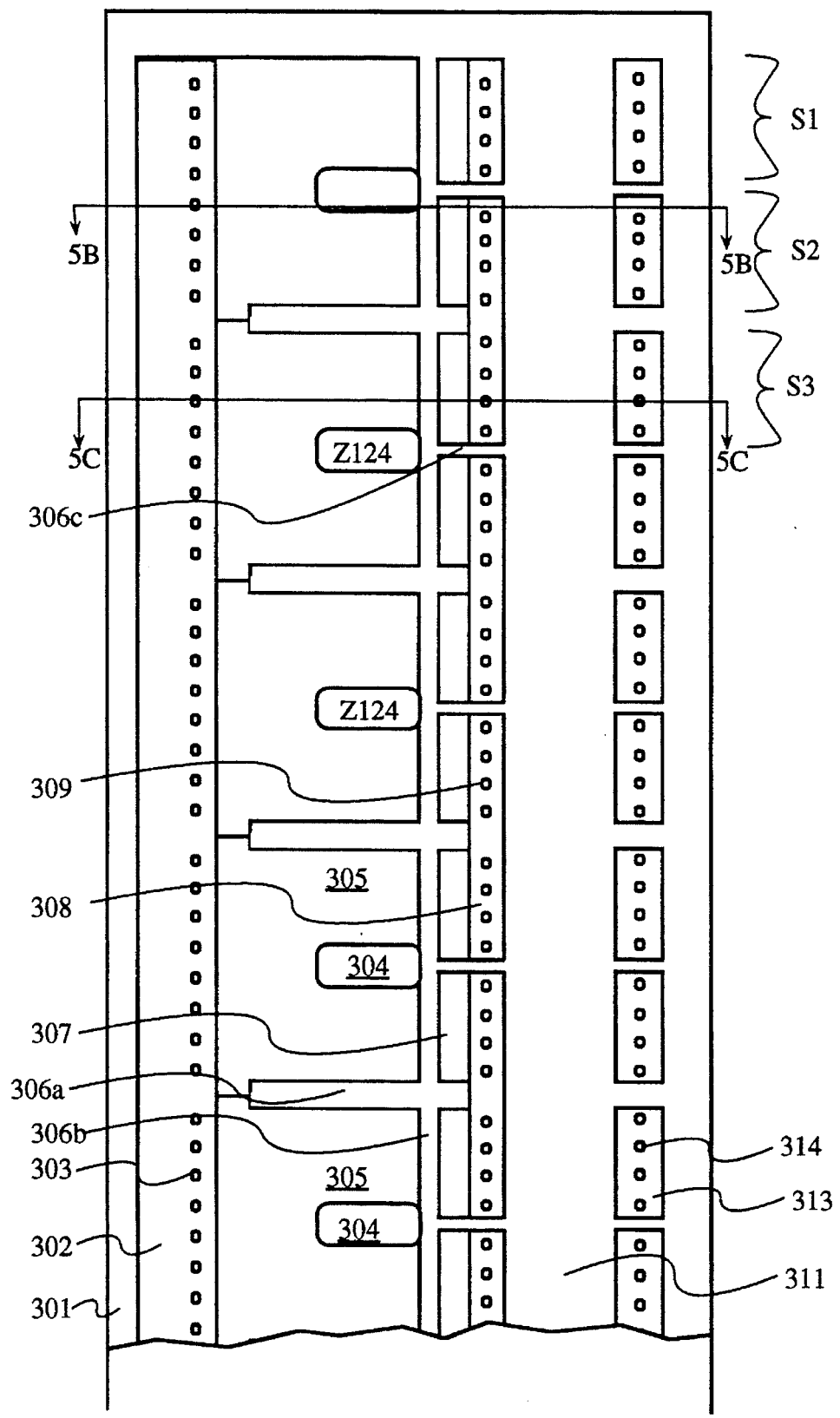
FIG. 5A shows a layout for ESD protection circuit 124 of FIG. 4A.
Figure 5B:
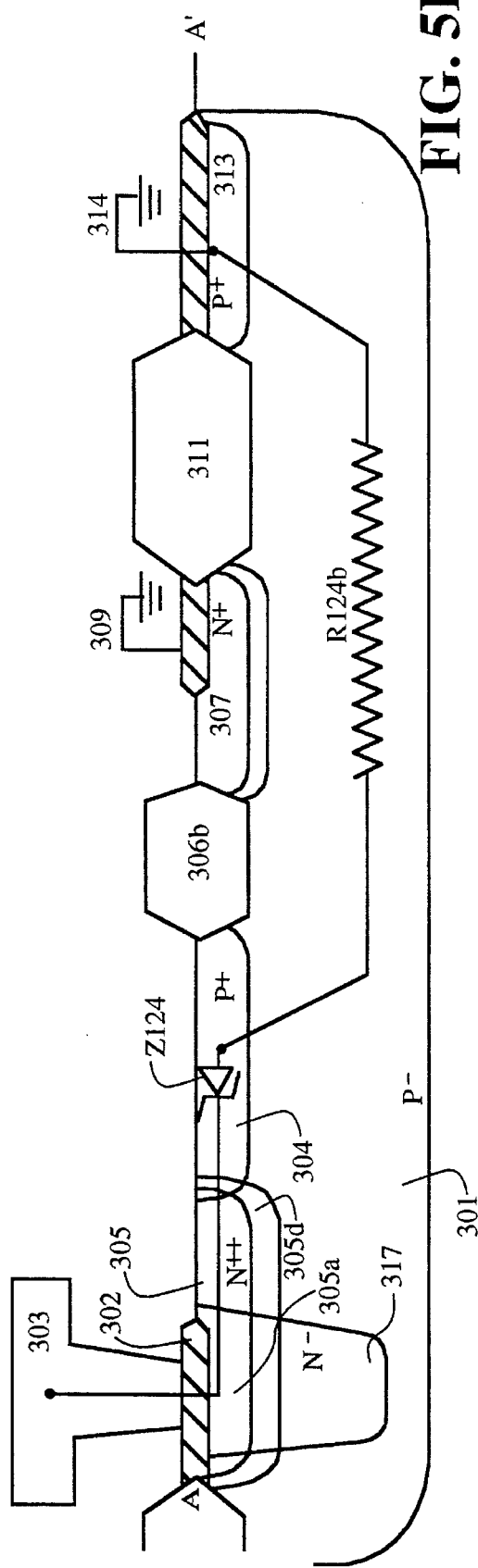
FIGS. 5B and 5C show cross-sectional views of two portions of FIG. 5A indicated as 5B and 5C respectively in FIG. 5A.
Figure 5C:
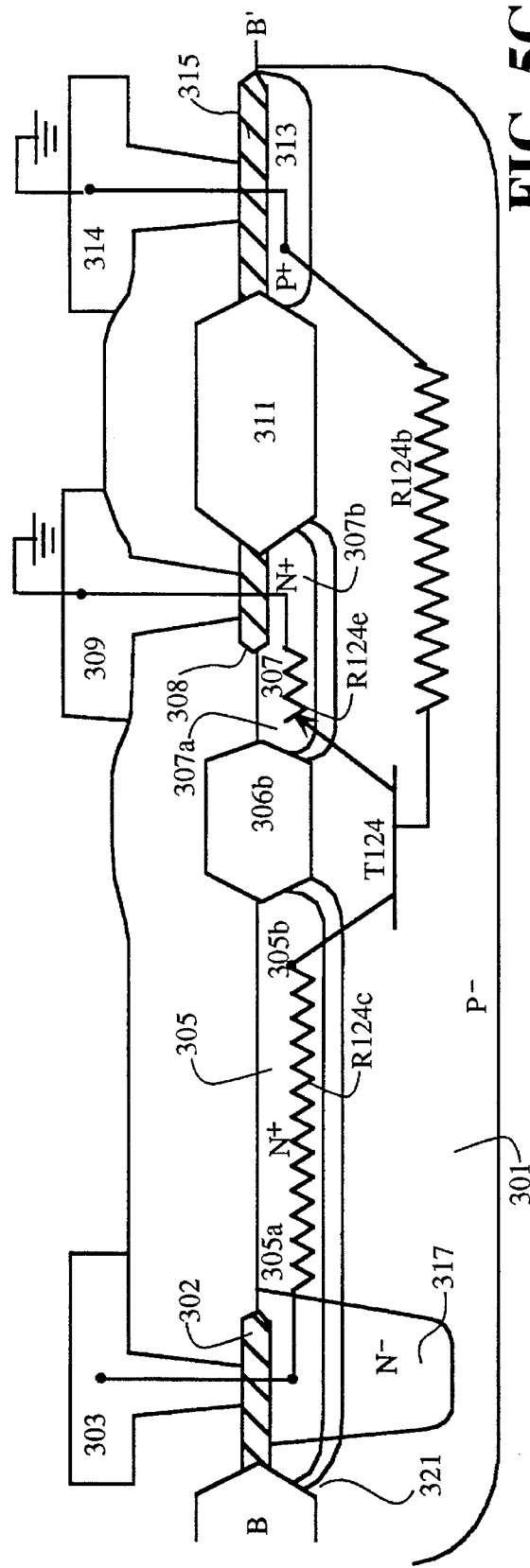

FIG. 5A shows a preferred layout which implements circuit 124 of FIG. 4A. FIGS. 5B and 5C show cross sectional views of this layout and also illustrate the circuit elements of FIG. 4A. Corresponding components have the same reference numbers in FIGS. 4A, 5A, and 5B. As can be seen in FIG. 5A, many such parallel transistors are formed, separated from each other at the collector and emitter regions by field oxide regions 306b, and separated every other one at the collector regions by field oxide 306a. For example segments S1 and S2 are joined at the left part of collector region 305 but separated at the right part of collector region 305 and joined at emitter region 307, whereas segments S2 and S3 are separated at both the collector and emitter regions by field oxide 306a. In another embodiment, an oxide wall extends the full length of a dividing line between segments of the collector. The field oxide prevents lateral current flow and further assures even current distribution between segments, so that the maximum ESD event can be tolerated.

Zener

Zener diode Z124 also helps to split adjacent segments of transistor T124 at the collector region. The P-diffusion of the Zener diode limits current flow between adjacent segments. Zener diode Z124 (FIG. 4A) is formed by creating a P+ diffusion region 304 (see FIG. 5A and FIG. 5B). The Zener diode is then at the junction between N++ region 305 and P+ region 304. By extending relatively close to contacts 303, P++ region 304 is shaped so that Zener diode Z124 triggers snap-back action at a relatively low voltage, thus dissipating high current before the ESD voltage begins to damage circuit components. To minimize high temperature effects from hot avalanche regions near Zener diode 304, contacts 303 are positioned away from Zener diode 304. In one embodiment, this separation between Zener diode 304 and contacts 303 is about 4 μm. Contacts 303 are also positioned away from the collector-base junction of the transistor, which is beneath field oxide region 306b. Base resistor R124b is formed in P-well 301 by positioning base contact 314 laterally apart from emitter contact 309. Resistor R124c and the collector of transistor T124 are formed in N+ region 305, contact 303 being positioned at the opposite end of region 305 from collector 305b (shown in FIG. 5C). The emitter of transistor T124 is formed in N+ region 307. Emitter contact 309 is positioned at one end of N++ diffusion region 307. Salicide regions 302, 308, and 315 surround contacts 303, 309, and 314 respectively. A salicide is a self-aligned silicide formed by depositing a refractory metal on the wafer surface, sintering to form the refractory silicide in regions where the refractory metal contacts silicon, and removing refractory metal where unreacted. In one embodiment the salicide regions are titanium silicide formed by depositing titanium on the wafer, with a mask preventing deposition of titanium in regions such as 305a and 307a (see FIG. 5C) which are to be resistive, sintering the structure to form titanium silicide, and removing unreacted titanium.

Salicide

Pad contact 303 is connected to N+ region 305 through a conductive contact area 302, for example a salicide such as TiSi or TaSi. This salicide region reduces resistance and therefore heat dissipation around the metal 303 contact area, so that metal pad contact 303 will not melt and fail during an ESD event. Although the embodiment described here includes salicide regions to minimize heat dissipation in the immediate contact areas, other embodiments are known which omit the salicide areas and still achieve significant ESD protection.

Collector Resistor

Figure 3A:
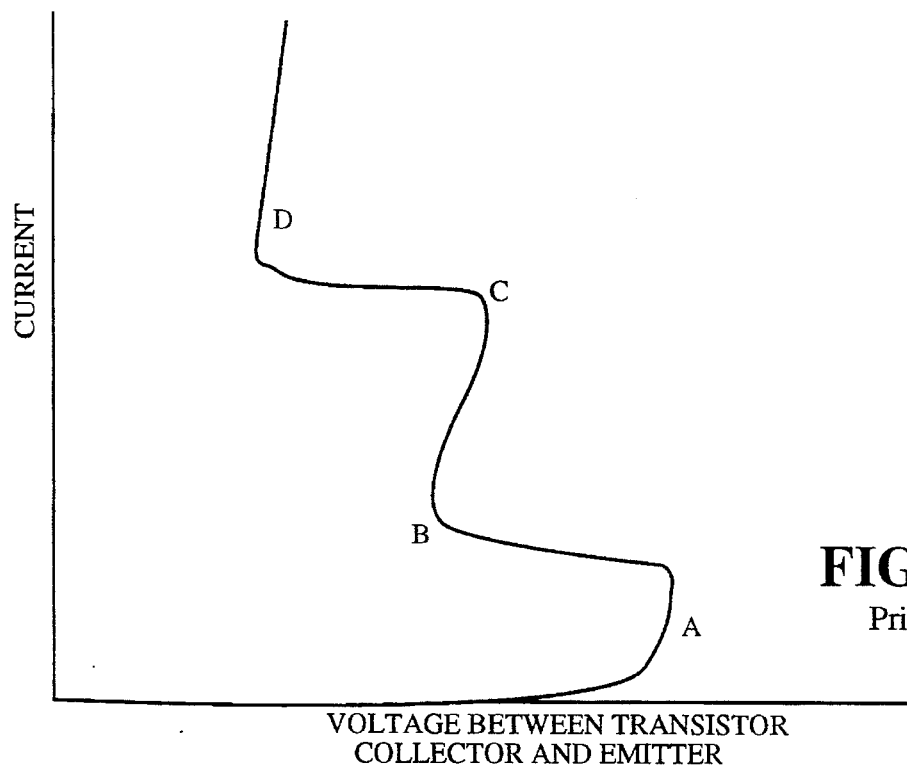
FIGS. 3A and 3B show characteristic curves for a bipolar transistor with and without a series resistor, respectively.
Figure 3B:
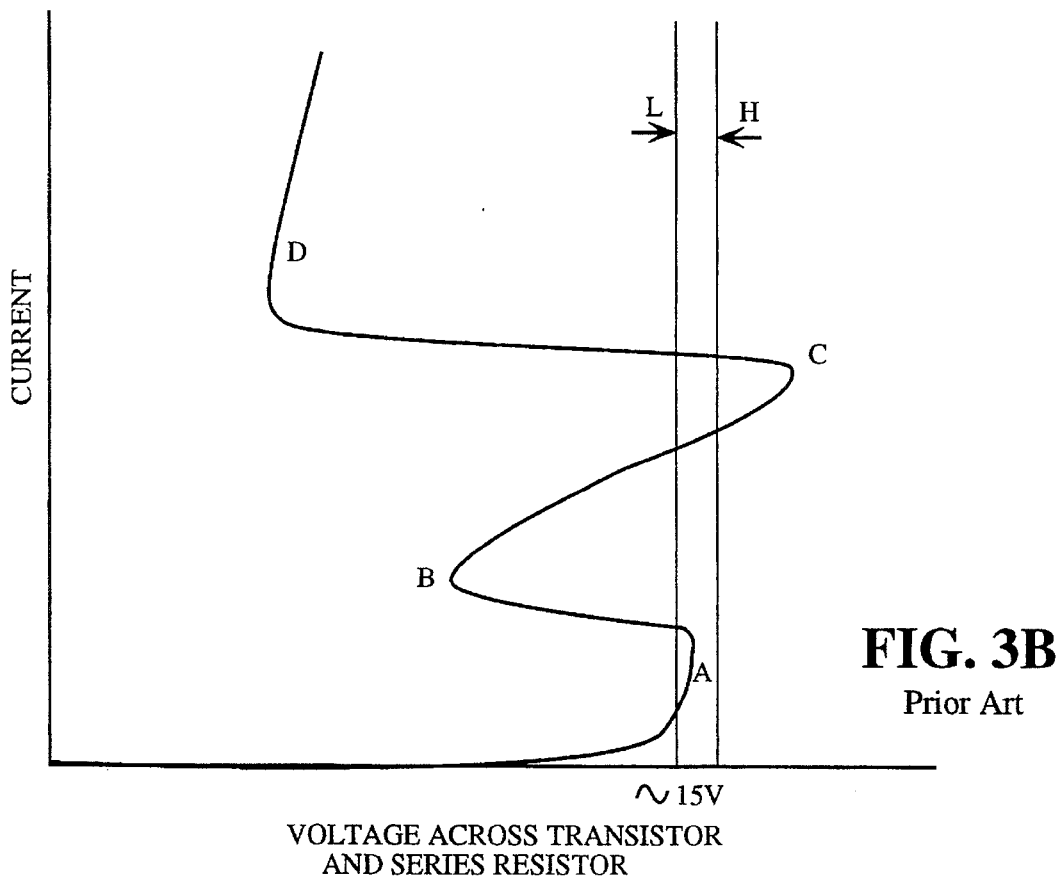
Figure 3C:
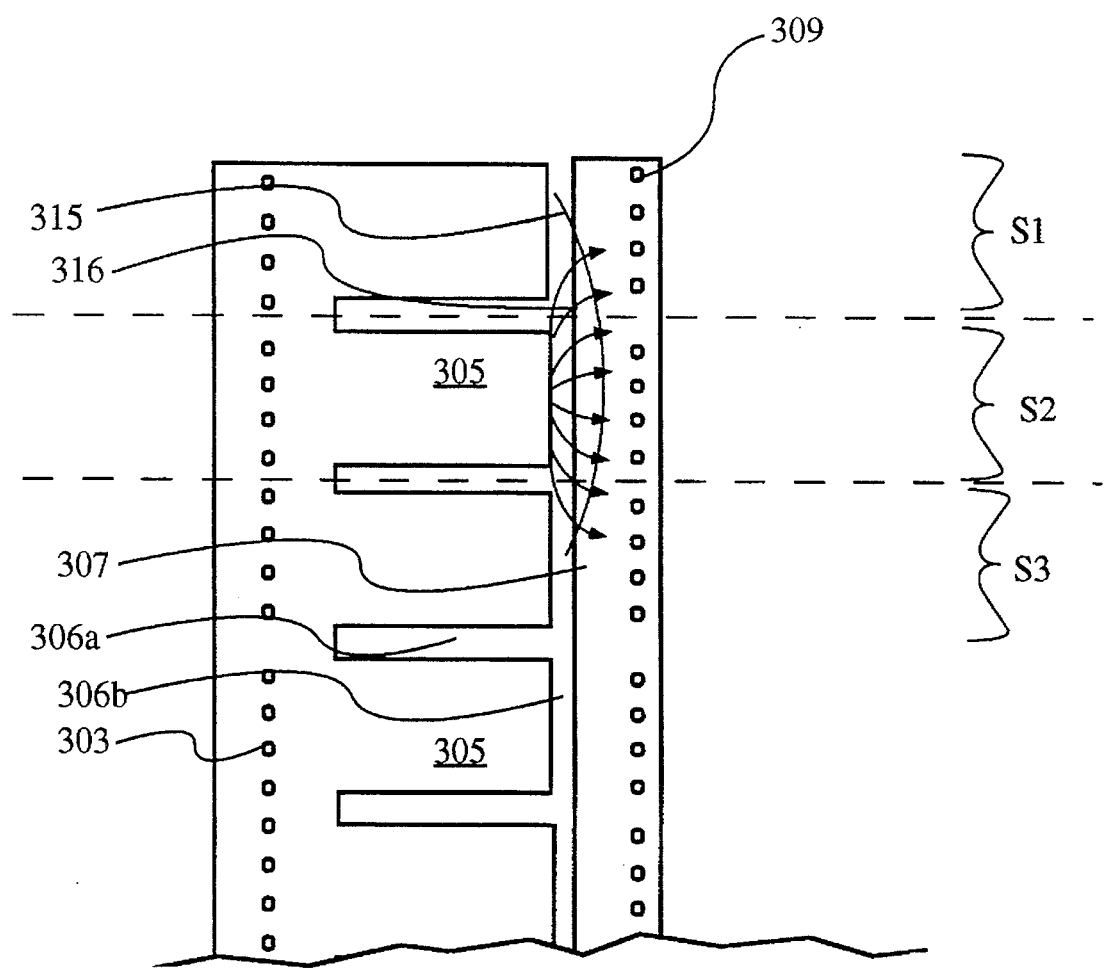
FIG. 3C shows a plan view of a split bipolar transistor showing lines of current flow from collector to emitter and an equipotential line.

As shown most clearly in FIG. 5C, N+ region 305 comprises region 305a which forms resistor R124c of FIG. 4A and region 305b, which serves as the collector of transistor T124. N+ region 305 is long enough to separate contacts 303 from the base region beneath oxide 306b. Thus when current flow is high (see the snap-back region between B and C of FIG. 3B) and considerable energy is being dissipated by resistor R124c and the collector-base junction beneath oxide 306b, the heat is dissipated over a large area, and the dissipation area is separated from contacts 303. In one preferred embodiment, the width of each segment is about 9.5 μm and the length is about 8 μm.

N-well Prevents Metal Spiking

To prevent metal spiking between salicide 302 and P-well 301 (i.e. the softening of salicide 302 under high current and metal migration through N+ region 305 to P-well 301 thereby shorting through the collector contact), deep N⁻-well 317 is formed.

No Channel Stop

As in certain prior art devices, in order to avoid a breakdown of the N-P junction between N+ region 305 and P-well 301, especially in region 321 near contact 303 where voltage drop is highest, a channel stop implant frequently provided at the collector edges is omitted.

Emitter Resistor

For good transistor operation, resistance in the emitter region is minimized. Thus, emitter region 307 is smaller than collector region 305. But it is also important that the metal emitter contacts be separated from regions of high power. Thus, in accordance with the present invention, the emitter contacts 309 are spaced apart from the high current part of the transistor base region beneath oxide 306b. Resistive region 307a is not covered by salicide, thus better supporting heat dissipation by increasing resistance and using only high melting point materials in the heat dissipation regions. Region 307b, close to contact 309 is covered by salicide 308, thus assuring good conductivity and minimizing heat dissipation near contact 309. Metal spiking between salicide 308 and P-well 301 is not a problem since contact 309 is connected to ground, thus no deep well comparable to well 317 is needed.

Since considerable heat is dissipated in the base region, particularly at the collector edge of field oxide 306b, this hot region is separated from both of metal contacts 303 and 309.

FIG. 5B

At the beginning of an ESD event, current begins to flow through Zener diode Z124 and resistor R124b (shown in FIG. 5B, also FIG. 4A). As shown in FIG. 5B, a large resistor R124b is formed in P-well 301 by locating the base contact region 313 away from collector 305b as separated by emitter 307. According to the invention, the distance from base contact 314 to the base region beneath field oxide 306b is more than twice the distance from emitter contact 309 to the base region. After Zener diode Z124 turns on, the high resistance value of resistor R124b provides a relatively high base voltage, thereby causing rapid turn-on of transistor T124 and movement into snap-back mode. In one embodiment, the distance between the base region beneath field oxide 306b and base contacts 314 is approximately 8 μm. To further reduce sensitivity to high voltage, diffusion regions 305, 307, and 313 receive a second implant. For example, in one embodiment, region 305 is implanted with low-diffusing arsenic to a high doping level ($5 \times 10^{15}$ atoms/cm$^3$) and with high-diffusing phosphorus to a lower doping level ($4 \times 10^{13}$ atoms/cm$^3$). This double implant forms a deep gradual junction which results in a more robust lateral NPN bipolar transistor. This results in more lightly doped region 305d, which produces a more gradual change in electron density and a resultant greater tolerance to high voltage gradients.

During an ESD event, as the voltage rises at pad contact 303, and correspondingly on N+ diffusion 305 above the breakdown voltage of Zener diode Z124, Zener diode Z124 begins to conduct. Zener diode diffusion region 304 initially dissipates considerable heat. Thus Zener diode region 304 is positioned away from contact 303. In one embodiment, this distance is about 4 μm. Zener diode Z124 is about 4 μm in length and 2 μm in width. The position and shape of Zener diode diffusion region 304 has a second advantage of further channeling current to flow in a horizontal direction in the illustration of FIG. 5A, avoiding hot spots. This heat dissipation through Zener diode diffusion region 304 is short-lived because as soon as transistor T124 turns on, most current flow is from pad 303 through salicide 302, through resistor R124c in region 305a (see FIGS. 5B and 5C), to the collector of transistor T124 at 305b, through the base region of transistor T124 located beneath oxide 306b, to resistor R124e in the unsalicided left portion 307a of N+ region 307, to salicide 308 and finally to contact 309.

In summary, the ESD protection circuit 124 of FIG. 4A is implemented as shown in FIGS. 5A, 5B and 5C so that high current flow is established quickly for dissipating a high charge without a voltage rise on the chip sufficient to damage or destroy the chip.

Output Transistors, NMOS Embodiment

Referring to output driver circuit 201 in FIG. 4A, pull-up and pull-down drivers T1 and T2 are both NMOS transistors. Pullup transistor T1 does not pull pad 101 to the voltage of the VCC rail. However, for ESD protection, N-channel transistor T1 has the advantage of including an intrinsic bipolar transistor, shown in dotted lines.

Figure 6A:
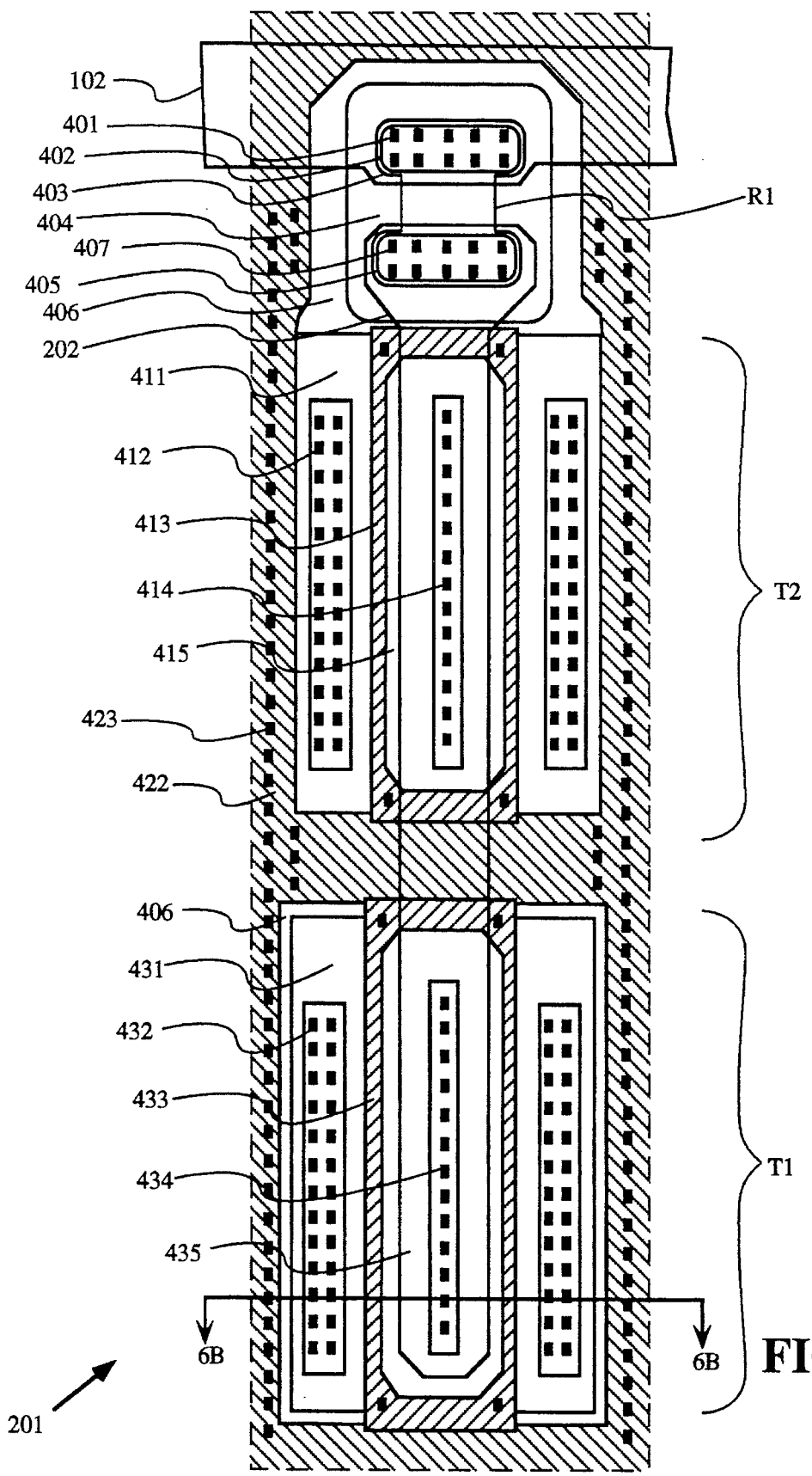
FIG. 6A shows a layout for a portion 201 of the six-part output driver circuit of FIG. 4A.

As shown in FIG. 4B, each output driver transistor such as transistor T1 of FIG. 4A is segmented, for example into six parallel transistors T1A through T1F. Output driver transistor T2 is also segmented into six parallel transistors T2A through T2F. Resistor R1 in FIG. 4A is likewise segmented into six parallel resistors R1A through R1F in FIG. 4B. Only one of the six output driver segments 201 is fully illustrated in FIG. 4A. Layout of one segment 201 is illustrated in FIG. 6A. Resistor R1 is shown at the top of the page. Line 102 (from pad 101 in FIG. 4A) is connected through pad contacts 401 in salicide region 402 to one terminal of resistor R1. Resistor R1 is formed of N+ diffusion 403. The contact regions of resistor R1 are overlaid with a salicide (self-aligned silicide) 402, for example titanium silicide, to achieve low resistance in the contact region, and therefore low contact heating during an ESD event. As mentioned earlier, in another embodiment, no salicide region is provided. The central resistive region is a half-square (i.e. the length is half the width) not overlaid with salicide, in order to produce sufficient resistance. The half-square resistor is doped to $5 \times 10^{15}$ atoms/cm$^3$, which at a typical thickness produces a resistivity of some 30 ohms per square, and thus a resistance of 15 ohms. The combination of six parallel resistors indicated in FIG. 4A and illustrated in FIG. 4B produces a resultant resistance of only 2.5 ohms, which is low enough to allow good circuit performance during normal operation, but aids in protecting transistors T1 and T2 from an ESD event while circuits 121, 122, and 124 are dissipating the ESD energy. Other values of resistance have also produced good ESD results.

Transistors T1 and T2 also dissipate ESD energy, further minimizing the effect of the ESD event, but are protected from excess heating (from current hogging) and caused to share current by resistors R1. Transistors T1 and T2 must drive considerable current during normal circuit operation. As can be seen in FIG. 4B, transistors T1 and T2 are relatively large devices, occupying relatively large chip area. Transistors T1 and T2 are therefore able to conduct significant ESD current without damage. In order to maximize heat tolerance of transistors T1 and T2, each of the four contact regions: i.e. ground contact region 412, pad contact region 414, pad contact region 434, and VCC contact region 432, comprises multiple contacts surrounded by a silicide region.

Figure 6B:
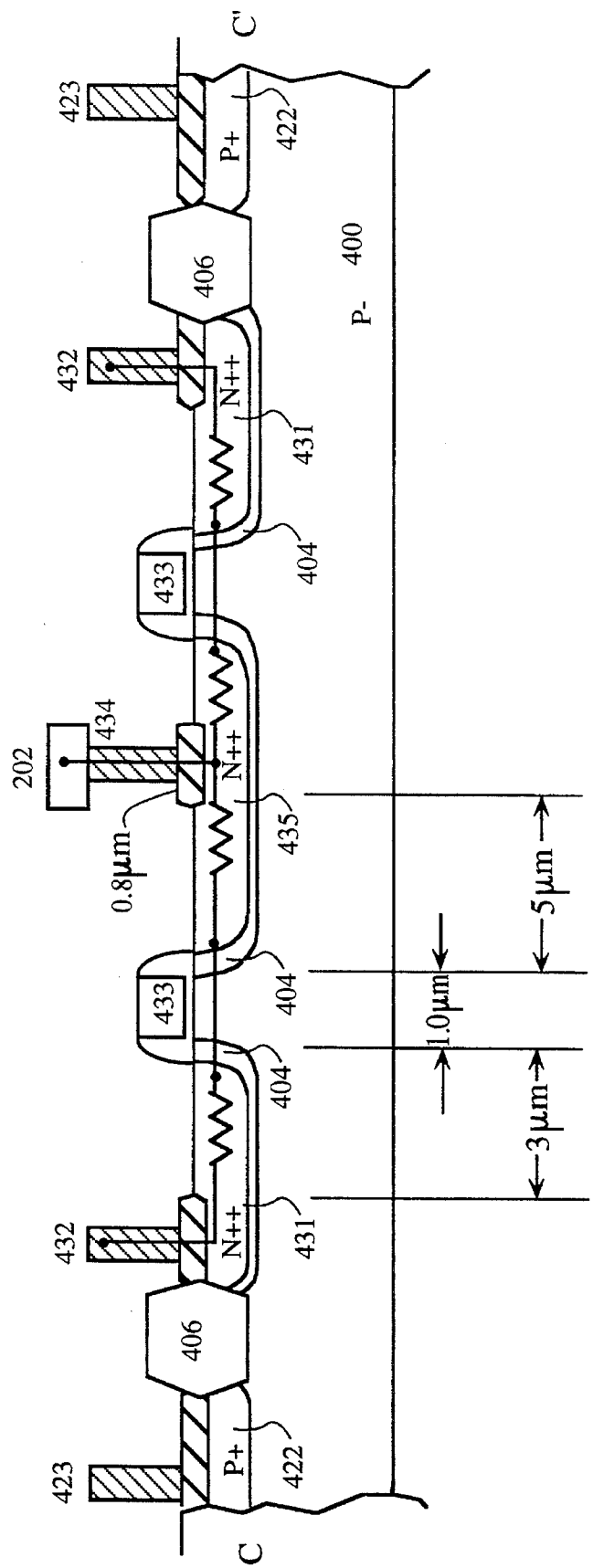
FIG. 6B shows a cross-sectional view of a portion of FIG. 6A taken along the line 6B in FIG. 6A.

FIG. 6B shows a cross section of FIG. 6A taken along the line labeled 6B of FIG. 6A. The same structures in the two figures are given the same reference numerals. The resistors shown in FIG. 6B are inherent in any transistor. In FIG. 6B, the resistors indicate regions of high energy dissipation. In the embodiment shown, salicide separates all regions of high energy dissipation from contact regions, in this case contact regions 432 and 434. As mentioned above, in another embodiment, this salicide is not provided. Regions 404 of FIG. 6B represent lightly doped regions which reduce sharp electron density gradients, as discussed above. In one embodiment, channel length (horizontal dimension) beneath gate 433 is 1.0 µm, length (horizontal dimension) of the source region is 5 µm and length (horizontal dimension) of the drain region is 3 µm. It is important to consider these distances as even a slight size shrink may produce a significant decrease in ESD tolerance. Note that contacts 432 and 434 are separated from the high resistance high heat producing regions of the transistor, again for better ESD protection. As seen by FIG. 6A, the lengths (e.g., horizontal dimension) of the drain, source and channel are smaller than the widths (e.g., vertical dimension) of the drain, source and channel. The same relationship is true with respect to the drain, source and channels of FIG. 6C and FIG. 6D.

Transistor T1 includes a parasitic bipolar transistor T1P, parasitic capacitor CP, and parasitic resistor RP2. These elements are shown with dotted lines in FIG. 4A. During an ESD event, this parasitic bipolar transistor assists in the discharge of ESD energy when pad 101 is made negative with respect to VCC. In addition to the ESD current path from VCC through transistor T121 to VSS and then through diode D124 to pad 101, an additional current path is provided through the parasitic bipolar transistor of transistor T1. FIG. 6B shows the elements of this parasitic transistor. P-well contacts 423 and P++ ground diffusion region 422 contact P- well 400, pulling well 400 to the voltage of VSS. When pad 101 goes negative, conductive line 202 is also pulled negative through resistor R1, thereby pulling N++ diffusion 435 negative. When the voltage at N++ diffusion 435 is about 1 volt below P- well 400, current flows from P- well 400 to N++ diffusion 435. P- well 400 has considerable capacitance and this current flow lowers the voltage of P- well 400. As current continues to flow, voltage of P- well 400 continues to decrease. When the voltage of P- well 400 is about 9 volts (in one embodiment) below the voltage of N++ diffusion 431, the parasitic bipolar transistor associated with transistor T1 turns on and begins to dissipate considerable power.

The embodiment shown in FIGS. 4A and 4B uses six output transistors in parallel. In order for these six transistors to dissipate maximum power without damage, all six transistors must turn on at approximately the same voltage and must carry approximately the same current. In accordance with this invention, layout of these transistors assists with this result. Six resistors R1 bias the six transistors in favor of conducting equal current, as discussed above in connection with FIG. 3B. Resistors R1 have the further effect of limiting current flow through transistors T1 during an ESD event. Therefore, the path of most current flow is through the ESD protection circuit including transistor T121 and diode D124.

In addition, as shown most clearly in FIG. 6A, each of the six transistors is caused to conduct current more uniformly through its own area by shaping diffusion region 422 to surround transistor T1, and by providing a metal conductive strip above diffusion region 422 with contacts 423 extending the full width (vertical dimension) of diffusion region 422. Source and drain regions of transistor T1 are also preferably contacted for most of their full width to assure equipotential and uniform current flow.

Output Transistors and ESD Protection, CMOS Embodiment

Figure 4C:
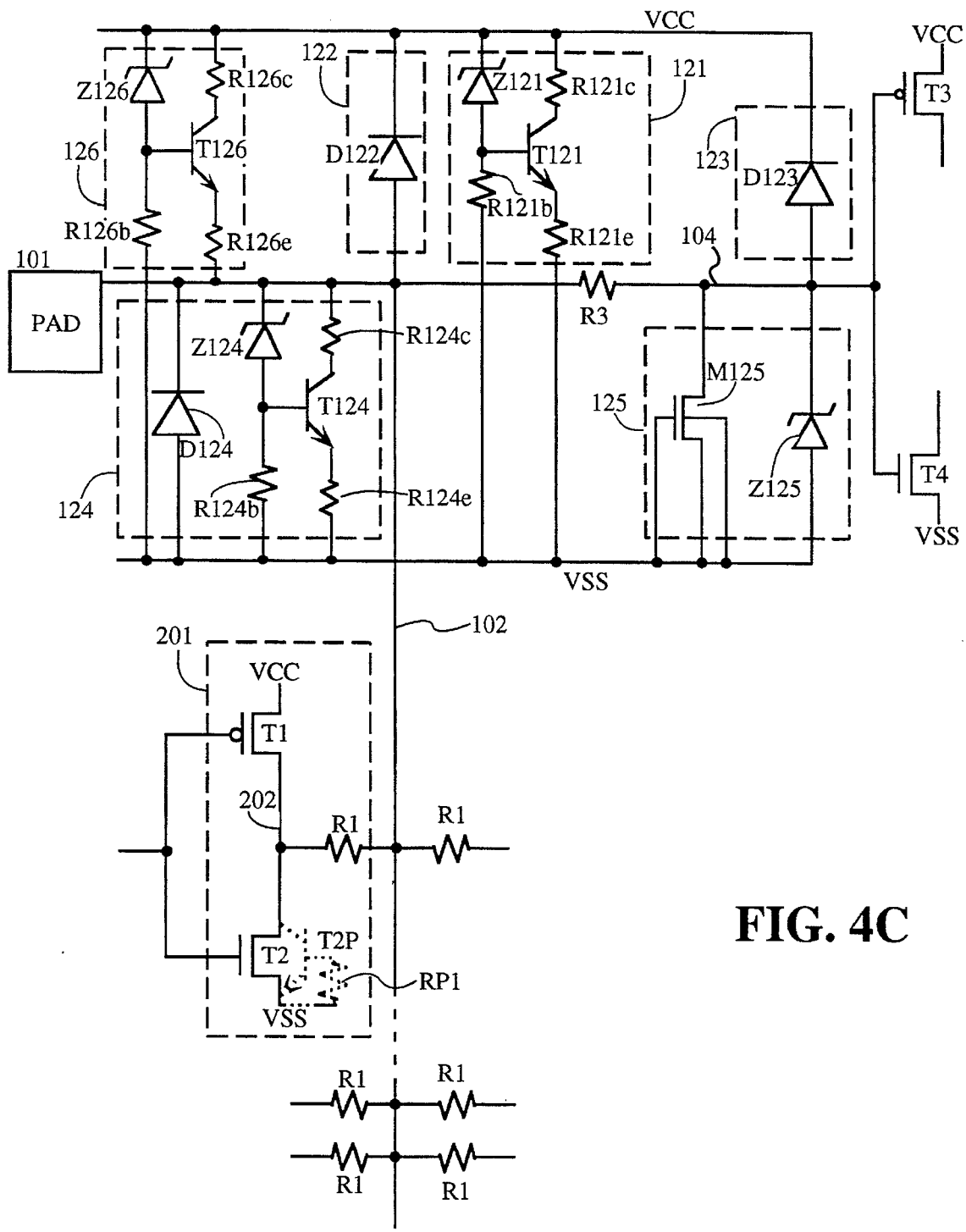
FIG. 4C shows a CMOS output driver circuit according to the invention which also improves ESD protection.

FIG. 4C shows a circuit in which output transistor T1 is a P-channel MOS transistor. Thus, in FIG. 4C, output driver circuit 201 is a CMOS output driver circuit. Unlike the circuit of FIG. 4A, transistor T1 does not provide significant additional ESD protection in the case where pad 101 receives a large negative voltage with respect to VCC. No parasitic transistor turns on to dissipate additional power in such a case. Yet when pad 101 must provide a full rail-to-rail voltage swing during normal operation, it is desirable to use a CMOS output driver.

Figure 6C:
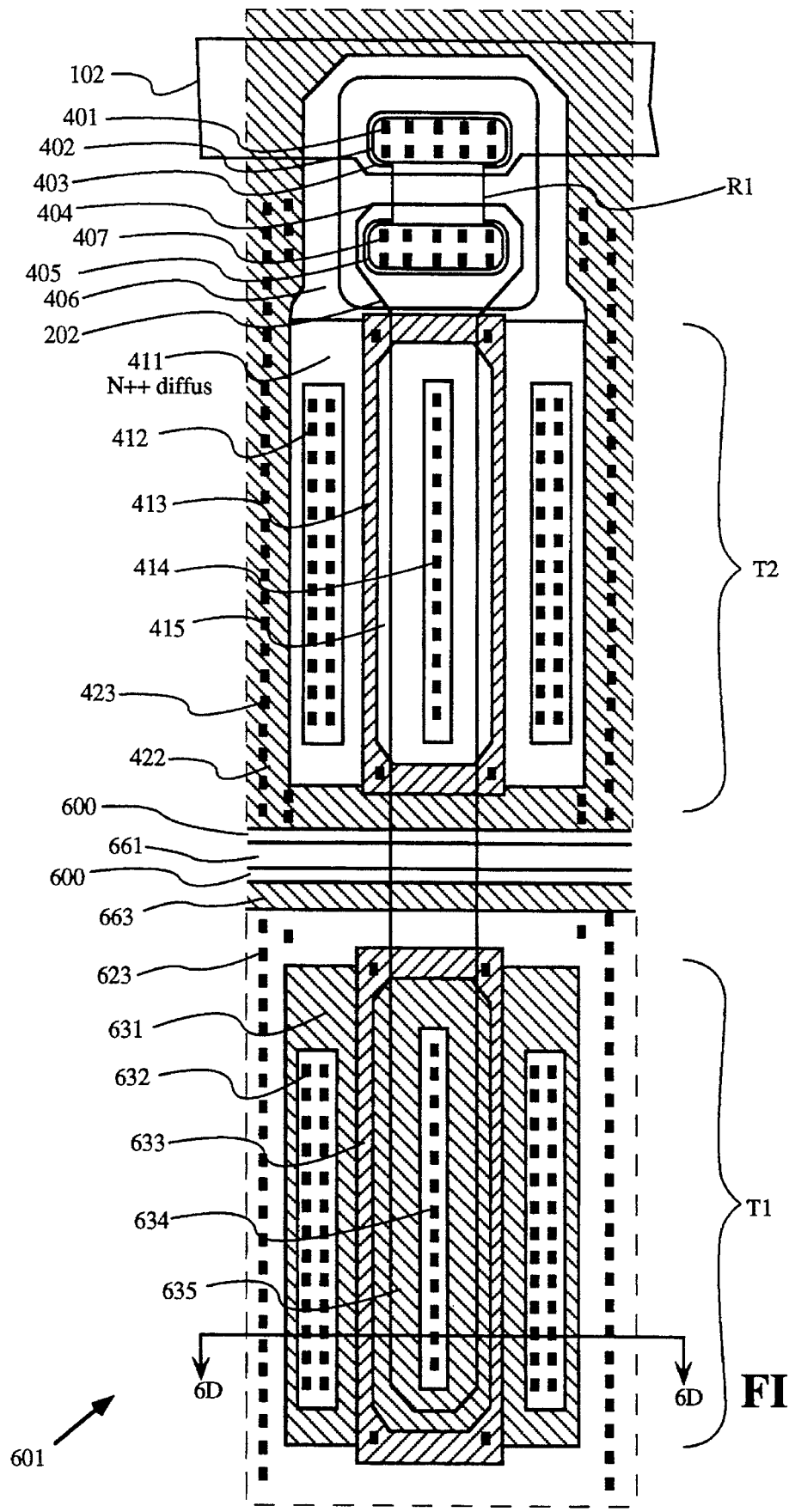
FIG. 6C shows a layout for a portion 201 of the six-part output driver circuit of FIG. 4C.
Figure 6D:
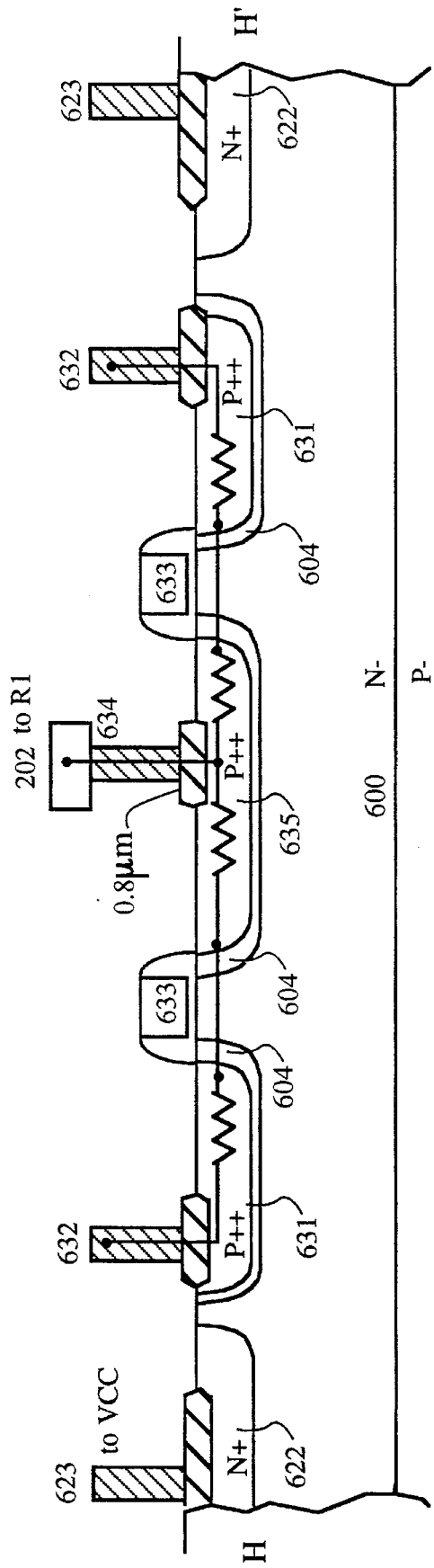
FIG. 6D shows a cross-sectional view of a portion of FIG. 6C taken along the line 6D in FIG. 6C.

FIGS. 6C and 6D show one layout of P-channel transistor T1 as implemented in FIG. 4C. FIG. 6C shows a top view and FIG. 6D shows a cross section taken along the line labeled 6D. The layout is similar to that of FIGS. 6A and 6B, except that P-channel transistor T1 is separated from N-channel transistor T2 by guardbands, and no field oxide is needed to separate the source region of transistor T1 from the well contact region. As shown in FIG. 6C, N well 600, against which P++ diffusion 422 is formed, is the basis for forming P-channel transistor T1. Guard bands of N++ diffusion 661 and P diffusion 663 are formed between transistors T1 and T2. Transistor T1 in FIG. 6C comprises P++ diffusion source region 631 which is connected to VCC through salicided VCC contacts 632, gate ring 633, and P++ diffusion drain region 635, which is connected through salicided contacts 634 to metal 202. Metal 202 can be seen in FIG. 4C to connect through resistor R1 to pad 101.

To provide ESD protection for the CMOS output driver of FIGS. 6C and 6D, an additional circuit 126 is added. Transistor T126 has its collector connected to VCC and its emitter connected to pad 101. The base of transistor T126 is connected through resistor R126b to VSS. When a low voltage ESD spike is experienced by pad 101 with respect to VCC, and VSS is floating (closer to the voltage of VCC), transistor T126 turns on, moving into snap-back mode (as discussed above with respect to transistor T121), and dissipates significant current from VCC to pad 101. This tends to protect P-channel transistor T1 from breakdown.

Layout of circuit 126 is similar to that of circuit 121 and therefore is not described in detail. Although not required, transistor T126 may be segmented to achieve maximum current uniformity. Zener diode Z126 provides pullup of the base of transistor T126 for faster turn-on of transistor T126 in response to a high voltage on VCC and low voltage on pad 101. Even without Zener diode Z126 (an alternative embodiment), an ESD event which pulls pad 101 low turns on transistor T126 because the base, which is connected to VSS, is at an intermediate voltage level (i.e. floating).

Figure 4D:
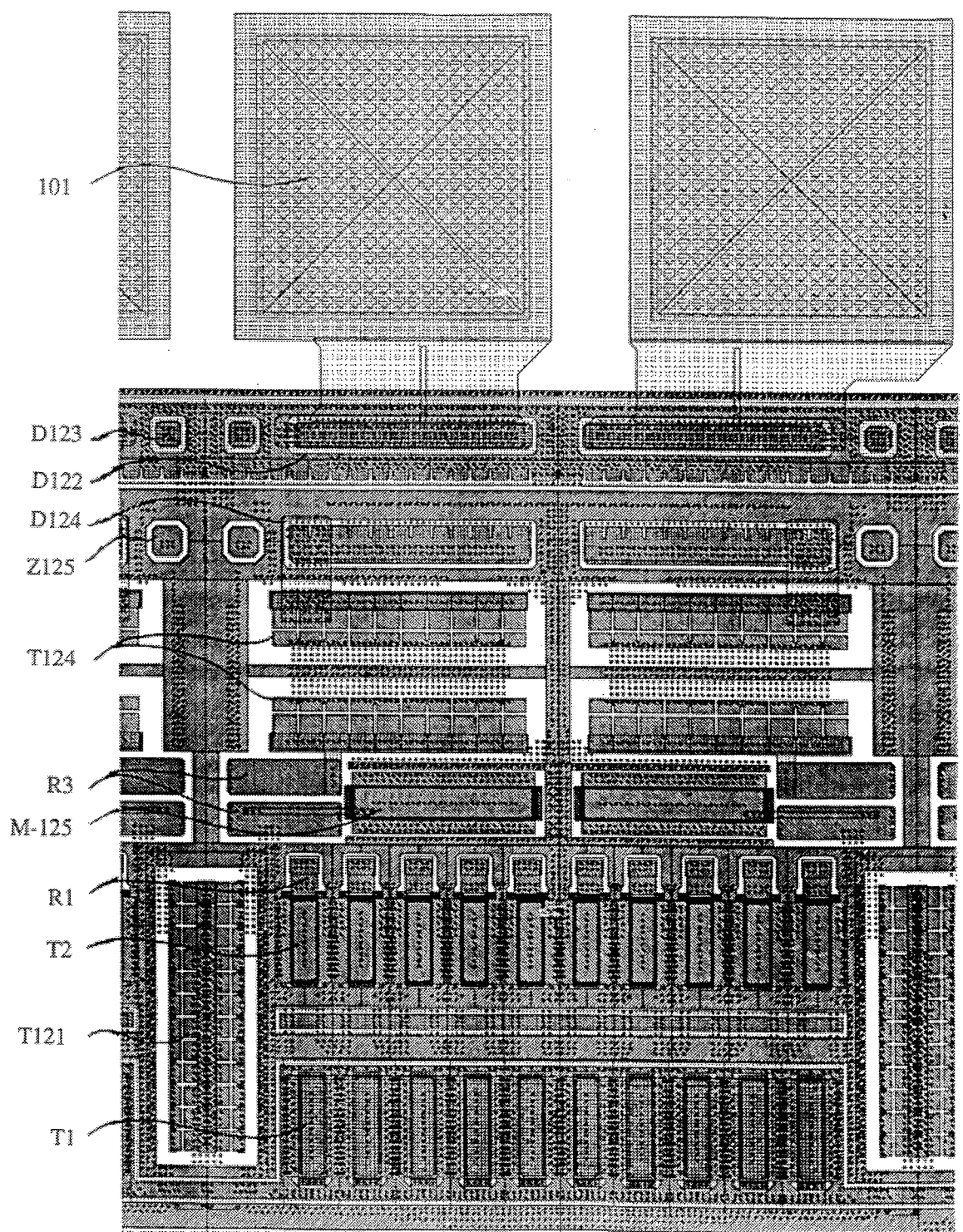
FIG. 4D shows a layout of the circuit of FIG. 4C.

FIG. 4D shows one layout of the circuit of FIG. 4C. In FIG. 4D, two pads 101 are shown, and the corresponding ESD protection structures including the output drivers for the two pads are also shown. Transistor T1 is implemented as five PMOS transistors, separated by guard bands from five NMOS transistors which implement transistor T2. Five resistors implement resistor R1, separating the output drivers from pad 101. In the embodiment of FIG. 4D, diodes D122 and D124 are positioned adjacent each other. Thus these two diodes form a parasitic bipolar transistor which can turn on in response to an ESD event. Without careful design such a parasitic transistor can cause ESD failure. Placing one of diodes D122 and D124 on the opposite side of pad 101 from the other one (an embodiment not shown) eliminates this parasitic transistor.

Gate Rings

Gates 413 and 433 are formed as rings rather than linear gates for several reasons. The top and bottom sections of the gate ring protect edges of field oxide 406. These top and bottom sections are high stress areas which can result in low breakdown voltages. If the field oxide edges serve as masks for diffusion regions, the sharp field (change in electron density) beneath the N++ diffusion region and a typical P+ channel stop implant of boron beneath the field oxide region will produce a low breakdown voltage. Forming the gate as a ring which covers the field oxide region assures that the source and drain implants are spaced apart from the channel stop implant, thereby producing a region having lower implant dosage and higher breakdown voltage. Furthermore, using a single ring distributes gate voltage more evenly around the gate. As another benefit, the ring shape with rounded inside corners eliminates narrowing of the gate with resulting reduced channel length and breakdown which sometimes occurs where a gate structure extends across a field oxide edge.

Gate Protection Structures

Figure 7A:
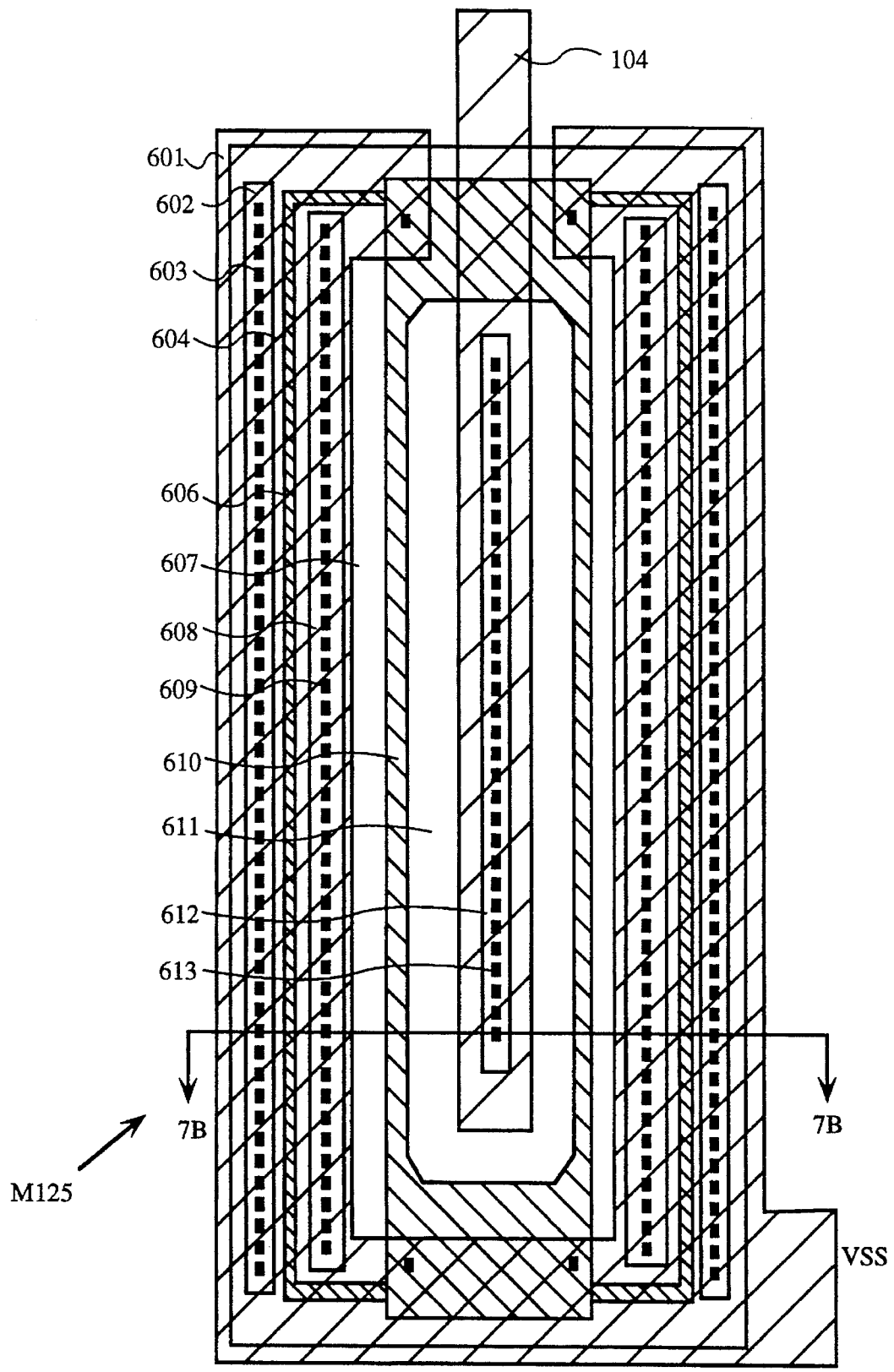
FIG. 7A shows a layout for MOS gate diode M125 of FIG. 4A.
Figure 7B:
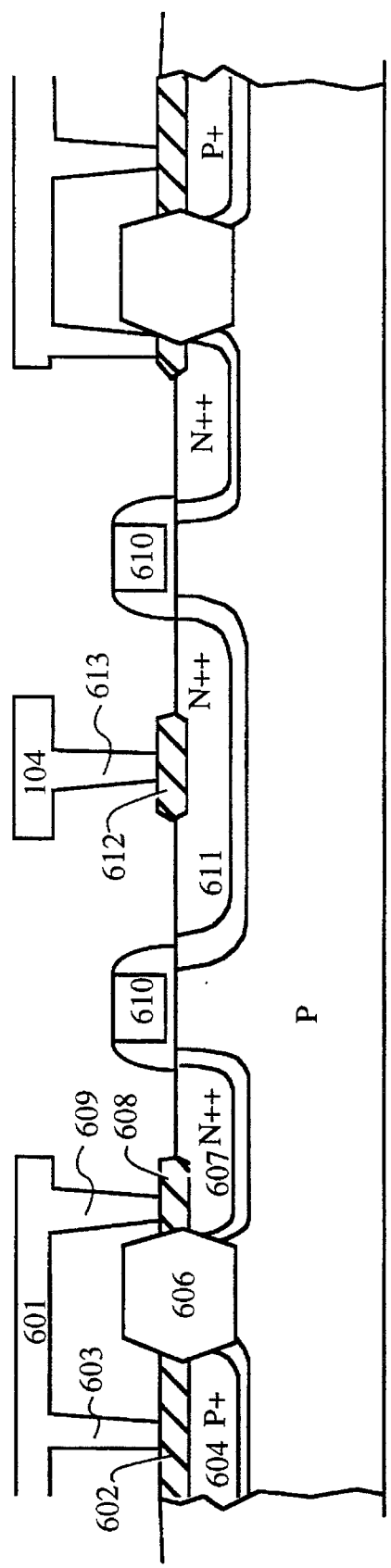
FIG. 7B shows a cross section of MOS gate diode M125 taken along the line 7B in FIG. 7A.

FIG. 7A shows a layout of MOS gate transistor M125 of FIG. 4A. FIG. 7B shows a cross section of FIG. 7A taken along the line labeled 7B of FIG. 7A. Structures in FIG. 7A are positioned so as to form a diode which can dissipate high current in response to higher voltage at the VSS terminal (represented by metal layer 601 in FIG. 7A) and a lower voltage on line 104. Current begins to flow when the voltage difference is less than 1 volt. For a voltage difference in the opposite direction, current begins to flow at about 12 to 15 volts in one embodiment. In other words, current begin to flow when voltage is less than the oxide breakdown of transistors T3 and T4. As shown in FIG. 4A, Zener diode Z125 begins to conduct at a lower voltage (8–9 volts), thus the two components Z125 and M125 work in parallel to increase ESD tolerance. In particular, the two components increase tolerance of the IC device to ESD events in spite of manufacturing process variation. Each of the contacts to VSS or to line 104 is surrounded by a salicide region which prevents high energy dissipation from occurring close to the contacts. In particular, salicide regions 602, 608, and 612 surround contact regions 603, 609, and 613 respectively. Note that in other embodiments, satisfactory ESD protection may be achieved without providing this salicide region. A further improvement in robustness to high voltage is provided, as shown in FIG. 7B, by the lightly doped regions around each of diffusions 604, 607, and 611. A gradual change in doping level of N++ regions such as regions 607 and 611 is achieved by first doping the regions with a phosphorus implant at a doping level of $2-4 \times 10^{13}$ atoms/cm$^3$ and later doping the regions with a source/drain phosphorus implant at a doping level of $3-5 \times 10^{15}$ atoms/cm$^3$. The high diffusion rate of phosphorus and lower doping level of the first phosphorus implant achieves a gradual decrease in the electron density at the edges of these N++ diffusion regions, thereby ensuring good bipolar transistor characteristics. In other embodiments, the salicide regions, the lightly doped regions, or both the salicide and lightly doped regions are not formed, thereby simplifying the manufacturing process and yet achieving satisfactory results.

As discussed above in connection with FIGS. 6A and 6C, gate region 610 is formed as a ring of polycrystalline silicon. Ends of polycrystalline silicon gate ring 610 extend over field oxide region 606, thereby protecting this region as discussed above in connection with FIGS. 6A and 6B.

Figure 8A:
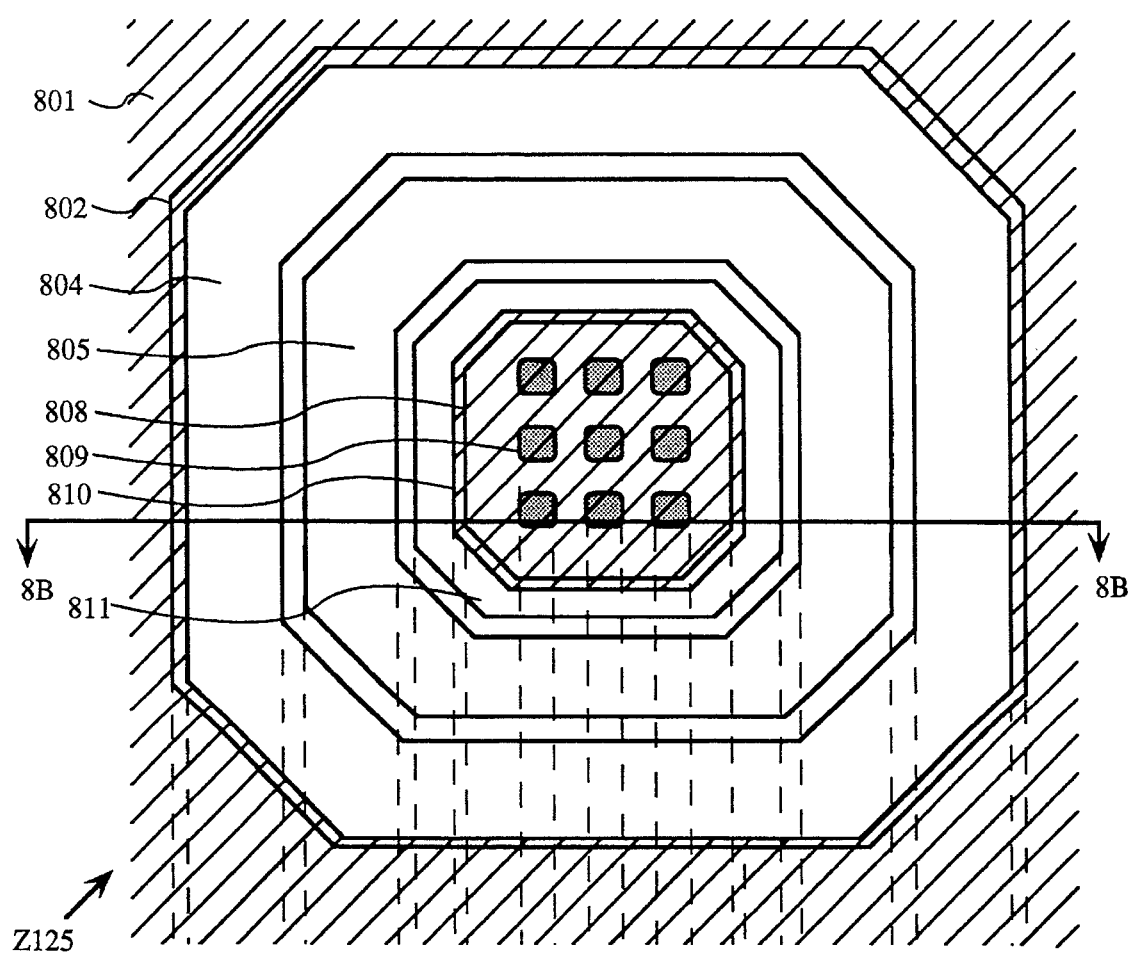
FIG. 8A shows a layout of Zener diode Z125 of FIG. 4A.
Figure 8B:
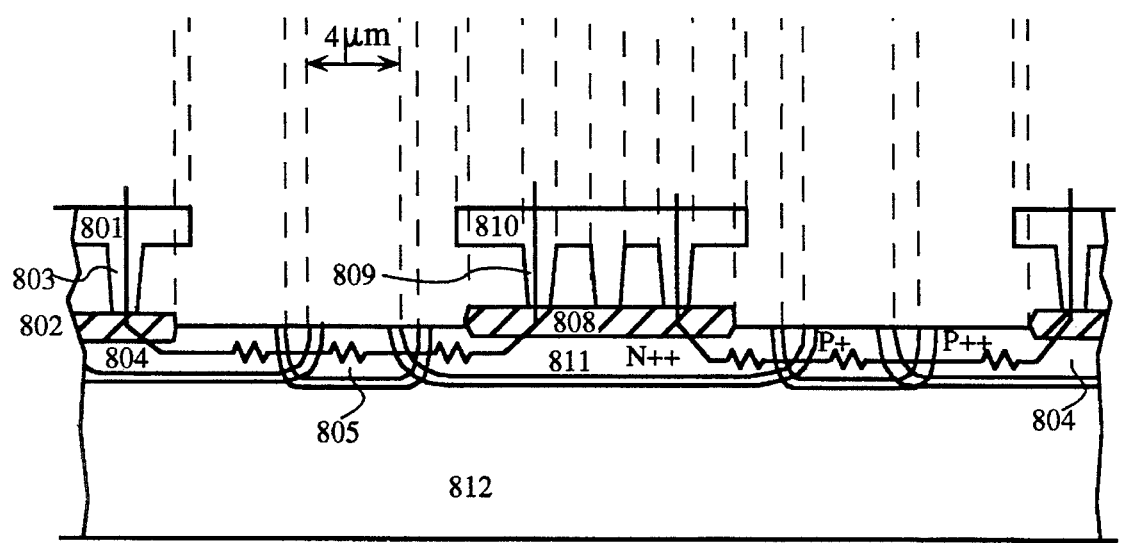
FIG. 8B shows a cross section of Zener diode Z125 as taken along the line 8B of FIG. 8A.

FIG. 8A shows one layout of Zener diode Z125 of FIG. 4A. FIG. 8B shows a cross section of FIG. 8A taken along the line labeled 6B. In the embodiment shown in FIGS. 8A and 8B, contacts 803 and 809, typically formed from aluminum, are surrounded by salicide regions 802 and 808, respectively. Salicide regions 802 and 808 are typically formed from, for example, titanium silicide or tantalum silicide or another refractory silicide, such that contacts 803 and 809 are protected from high heat in their immediate vicinity. Some energy dissipation occurs at the portion of N++ diffusion region 811 indicated by a resistor. P+ diffusion 805 forms the Zener diode Z125, thereby achieving breakdown in the reverse bias direction at between 8 and 10 volts. This Zener diode breakdown voltage is considerably less than the oxide breakdown voltage of transistors T3 and T4. When an ESD event occurs, Zener diode region 805 also experiences energy dissipation as indicated by the resistor in this region, and therefore experiences high heat. However, Zener diode region 805 is separated from salicide regions 802 and 808 by unsalicided regions of N++ diffusion 804. Therefore the layout provides immunity to failure from overheating of the salicides 802 and 808. P++ region 804 also dissipates some ESD energy. Regions of energy dissipation are indicated by resistors in FIG. 8B. However the resistive region is separated from contact 803 by salicide 802. Thus the regions which become the hottest are separated by the greatest distance from the regions having the lowest melting points.

Figure 9A:
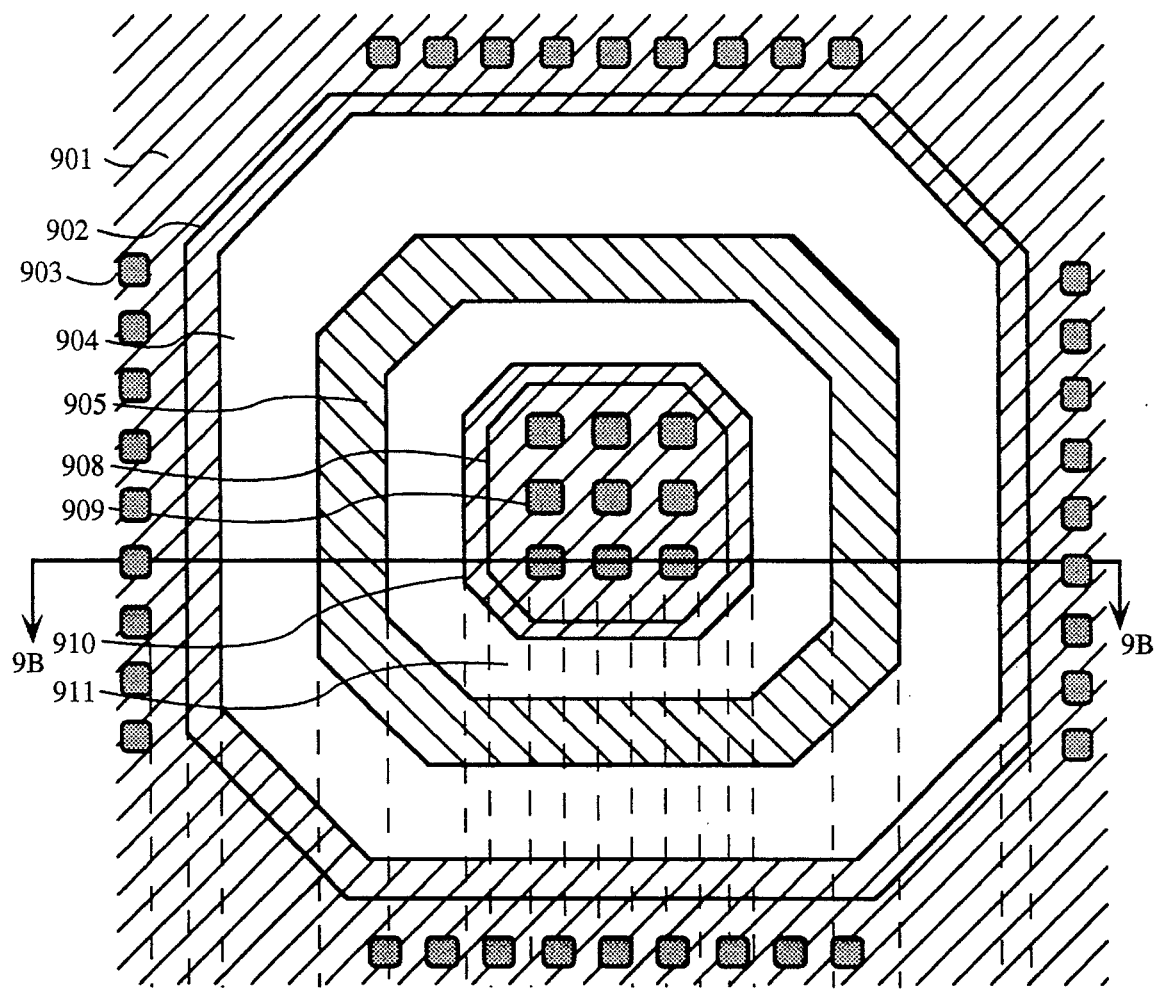
FIG. 9A shows a layout for oxide-protecting diode D123 of FIG. 4A.
Figure 9B:
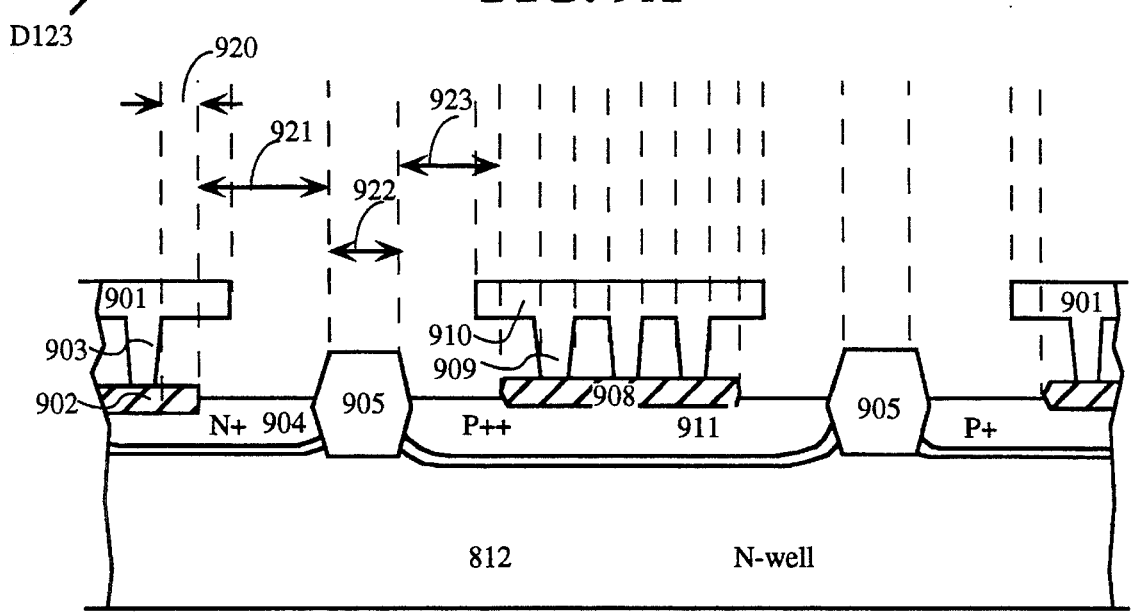
FIG. 9B shows a cross section of diode D123 taken along the line 9B in FIG. 9A.

FIGS. 9A and 9B show the layout and cross section of diode D123 of FIG. 4A. As with other structures, regions of high energy dissipation are separated from materials having a low melting point. In the embodiment shown in FIGS. 9A and 9B, contacts 903 and 909 are surrounded by salicide regions 902 and 908, respectively, and regions 902 and 908 are in turn separated from the region of highest energy dissipation. The highest energy dissipation occurs in N well 812 beneath field oxide 905. FIG. 9B indicates that the salicide region, for example salicide 902, provides a barrier 920 of 0.9 μm while the resistive portion of N+ well 904 provides a lateral separation 921 of 2.5 μm between field oxide 905 and salicide 902. The lateral spacing 922 of field oxide region 905 is preferably 2 μm while the spacing 923 of the resistive portion of N++ region 911 is 2.5 m. Of course, other dimensions will be used in other embodiments, and depend on doping level, device size, design rules, and other features.

Figure 10A:
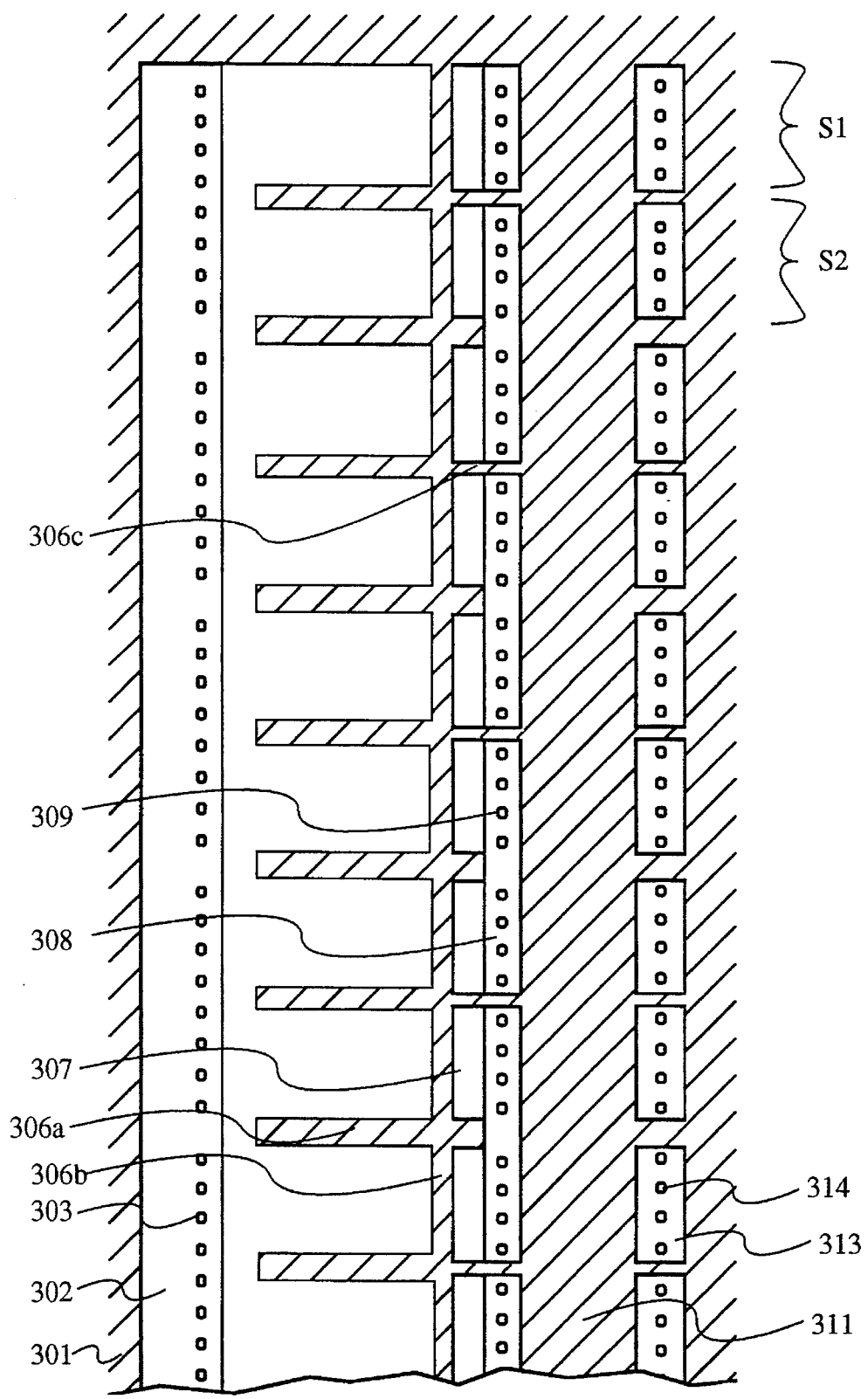
FIG. 10A shows an alternative layout to that shown in FIG. 5A.
Figure 10B:
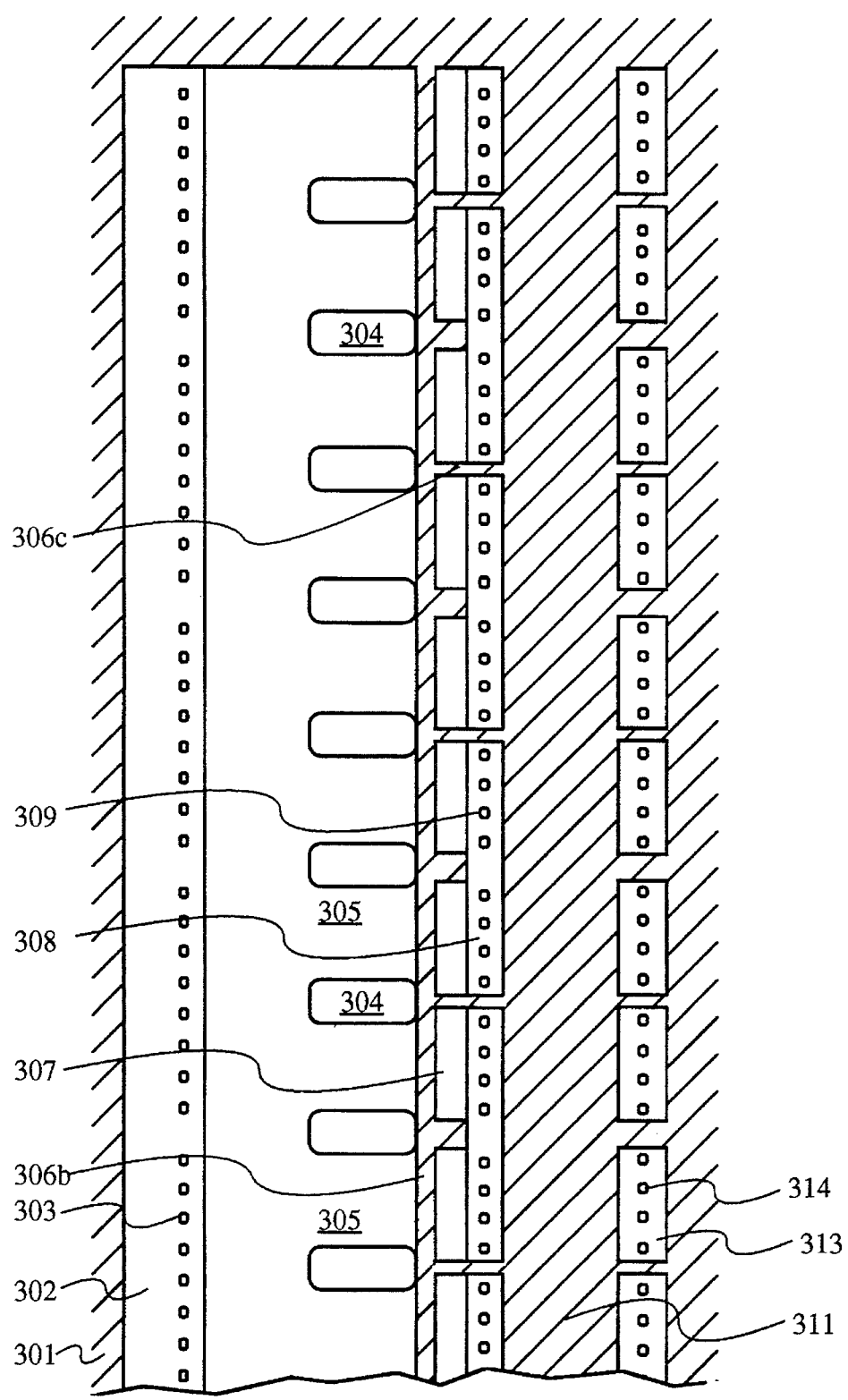
FIG. 10B shows another alternative layout to that shown in FIG. 5A.
Figure 10C:
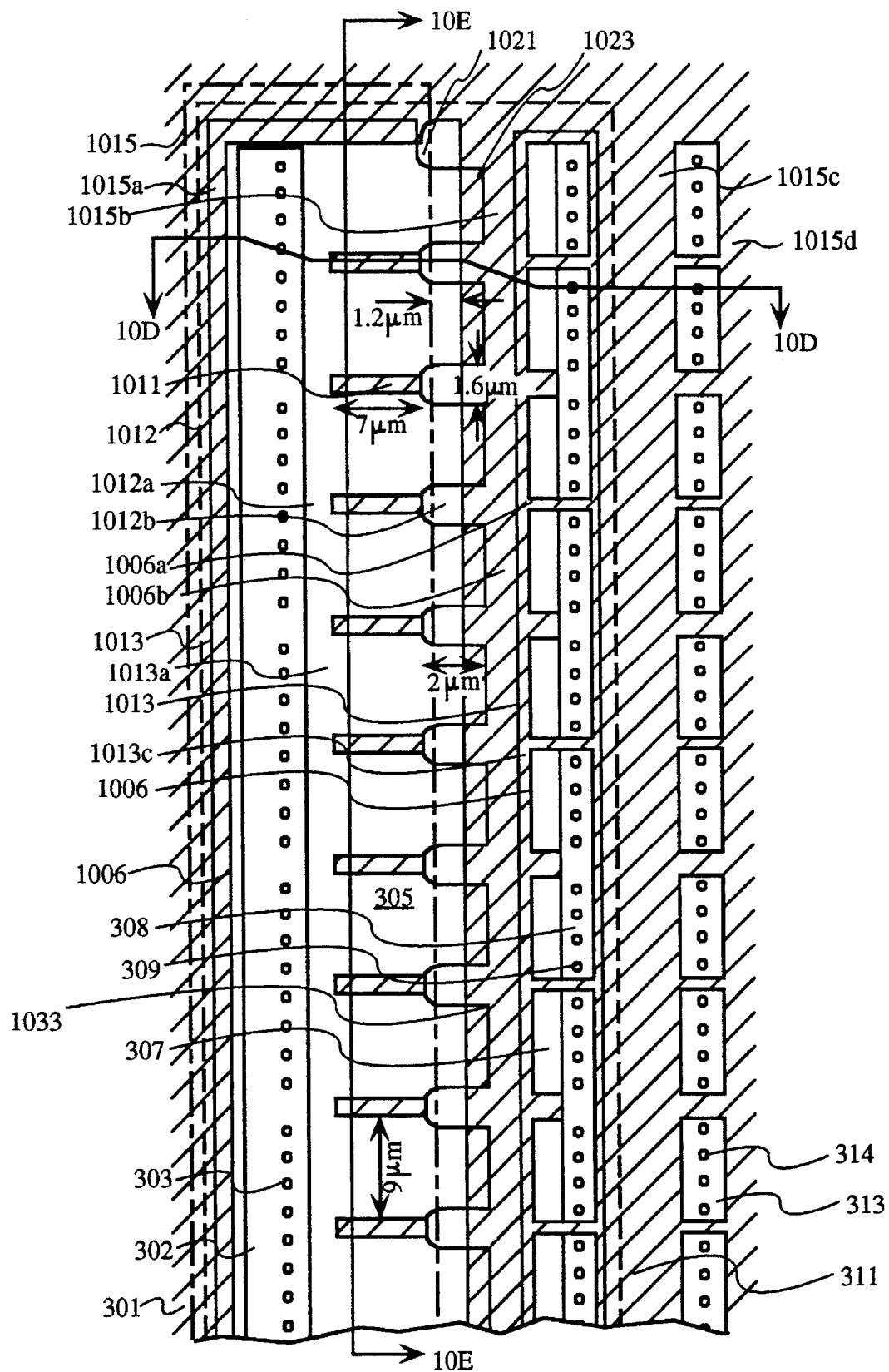
FIG. 10C shows yet another alternative layout to that shown in FIG. 5A.

FIGS. 10A, 10B, and 10C show three alternative embodiments to the layout shown in FIG. 5A. As shown in FIG. 10A, the split bipolar transistor is separated by repeated field oxide sections 306a which prevent current hogging, as was also prevented in the embodiment of FIG. 5A by the combination of field oxide dividers and zener diodes 304. The embodiment of FIG. 10A has the advantage of providing good isolation from lateral current flow. In this manner, if a defect occurs in one of the transistor portions, the current flow through that defect will be limited, thereby effectively avoiding current hogging by the defect. However, without the Zener diodes, the threshold at which the transistor begins to conduct will be higher the threshold voltage provided by the transistor of FIG. 5A.

FIG. 10B shows an alternative embodiment in which separation is achieved by a plurality of zener diodes 304, and no field oxide separators are used in the collector region. This embodiment has a lower turn-on voltage, and is therefore particularly useful for the connection from VCC to VSS which must protect internal components.

FIG. 10C shows an embodiment in which field oxide separators 1011 are provided in combination with a lightly doped region 1012b to separate the segments of the split bipolar transistor from each other. The embodiment of FIG.

Figure 10D:
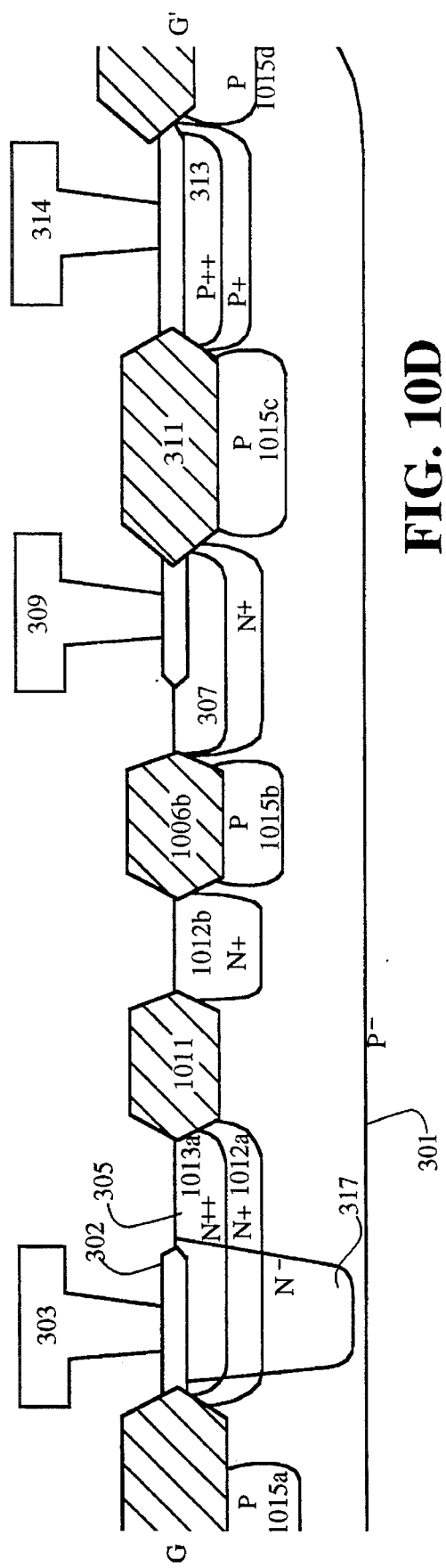
FIGS. 10D and 10E show cross-sectional views of two portions of FIG. 10C indicated as 10D and 11E in FIG. 10C.
Figure 10E:
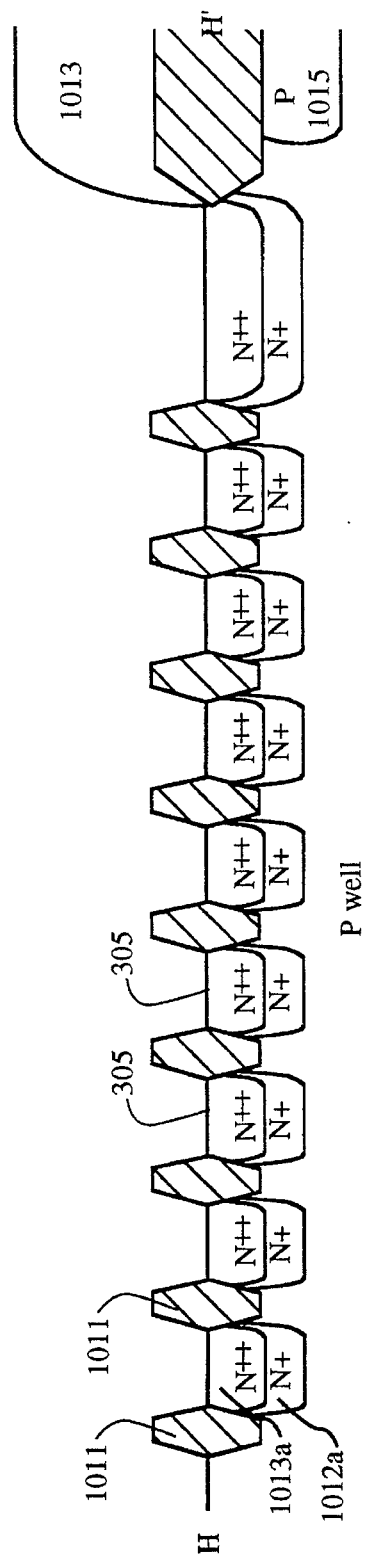

10C achieves an increased ruggedness against breakdown by avoiding sharp field changes at any field oxide corners. FIGS. 10D and 10E show cross sections of portions of FIG. 10C taken along the line labeled 10B and the line labeled 10E shown in FIG. 10C. Boundaries of the individual mask layers are also shown in FIG. 10C. The embodiment of FIG. 10C uses field oxide walls 1011 to separate segments of the bi-polar transistor, in combination with lightly doped regions 1012b to avoid lateral current flow, thereby preventing current hogging. The combination of field oxide region 1011 and lightly doped area 1012b provides junctions between N+ and N− regions at flat field oxide boundaries and results in very high ESD voltage tolerance. The rounded shape at the left portion of each lightly doped N+ area 1012b achieves a gradual change in electron density at the right corner of field oxide region 1011. Field oxide region 1006b has a flat left edge adjacent right edges of lightly doped N+ area 1012b and the heavily doped N++ region formed by mask 1013. Since the surface of field oxide region 1006b is flat at the junction of lightly doped areas 1012b and heavily doped areas 1013, the change in electron density at the edge of the field oxide region is gradual and produces minimum tendency toward breakdown. The embodiment of FIG. 10C is particularly useful for an application in which the standard operating voltage is relatively high with respect to breakdown voltage of the device. For example, in a device which will be used to program antifuses at a programming voltage on the order of 10–12 volts, the embodiment of FIG. 10C may be used to assure that junctions in the ESD protection circuit are robustly nonconductive during normal circuit operation including antifuse programming. If junctions in the split bipolar transistor (such as T121 or T124 of FIG. 5A) were to leak during high voltage antifuse programming, the bipolar transistor would move into the snap-back mode, conducting high current and preventing the programming of an antifuse. Antifuses would have to be programmed at a lower voltage, and this might not be acceptable. The embodiment of FIG. 10C offers a flat collector-base junction, which remains robust after an ESD event because there are no sharp field corners at the collector base junction.

Referring to FIG. 10C, field implant mask 1015 is positioned to prevent the implantation of a channel stop P-type dopant (such as boron) beneath the field oxide separators 1011 and also adjacent the corner 1021 of N++ implant region 1013. Channel stop field implant mask 1015 also prevents a high dopant level near the junction between N++ region 1013a and channel stop region 1015a (see FIG. 10D). In FIG. 10C, note that sharp corners 1023 exist between N++ region 1013a and lightly doped N+ region 1012. However, these sharp corners are not in active regions of the device and therefore are not under high stress in response to an ESD event. Junctions 1033 between N++ region 1013a and lightly doped N+ region 1012 are against a flat portion of field oxide region 1006b. In another embodiment, not shown, the N+ mask includes all rounded corners. (Of course, the drive-in heating step typically used in device manufacture does produce rounded corners even when the mask has sharp corners.)

Figure 11:
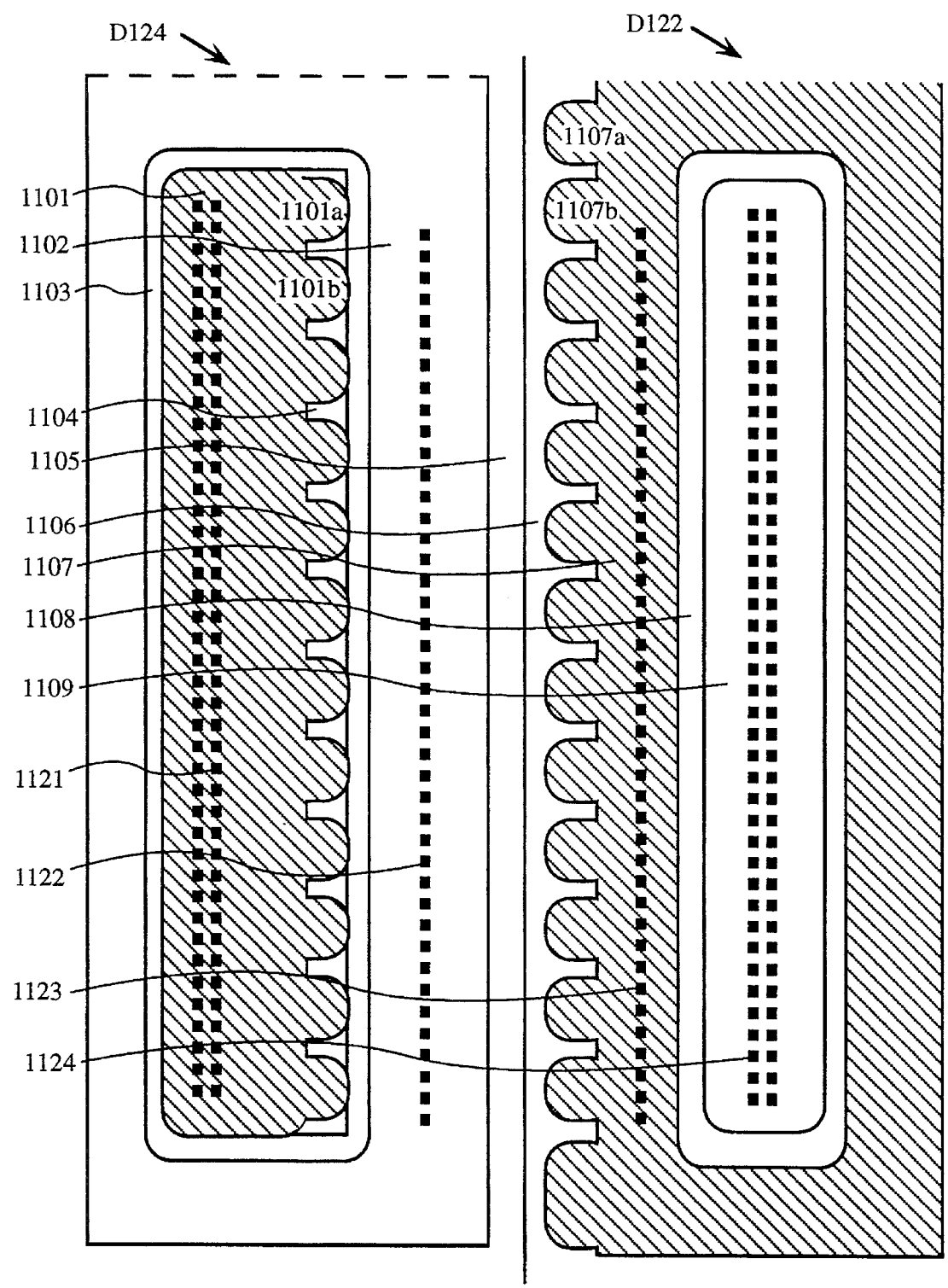
FIG. 11 shows a layout of diodes D122 and D124 of FIG. 4A.

FIG. 11 shows a layout of diodes D122 and D124 of FIG. 4A. These two diodes are for protection against an ESD event driving current opposite to the direction of normal current flow. The cathode of diode D124 is N diffusion region 1101, which is surrounded by field oxide 1103. The anode of diode D124 is formed from P diffusion 1102, which surrounds field oxide 1103. A row of P diffusion contacts 1122 connect P diffusion anode 1102 to the VSS line. One or more (two shown) rows of cathode contacts 1121 connect N diffusion region 1101 to pad 101 (pad shown in other figures).

Diode D122 comprises an anode formed in P diffusion region 1109 which is connected to pad 101 through contacts 1124. P diffusion region 1109 is surrounded by field oxide 1108, which is surrounded by N diffusion 1107, which connects through contacts 1123 to the VCC line.

As laid out in FIG. 11, diodes D122 and D124 form a parasitic bipolar transistor. The collector of this bipolar transistor is the N diffusion cathode 1107 of diode D122. The base is the P diffusion anode 1102 of diode D124. The emitter is the N diffusion cathode 1101 of diode Di24. In order to prevent this parasitic bipolar transistor from becoming a cause for device failure, the layout is adjusted to add fingers such as 1101a separated by oxide walls 1104 to N diffusion 1101 and add fingers 1107a to N diffusion 1107. These fingers serve two purposes: they add resistance to the path between collector and emitter, and they bias current flow in a horizontal (as shown in the figure) direction to prevent current hogging and hot spots. The emitter resistors such as 1101a are particularly effective in limiting transistor current. Thus, the layout of diodes D122 and D124 provides additional ESD protection beyond that of intrinsic reverse biased diodes present throughout the device.

To promote uniform current flow for maximum ESD protection, contacts 1121, 1122, 1123, and 1124 extend most of the length of the diodes but are positioned away from any P-N junction.

In one embodiment the ESD protection circuit comprises:
a pad which makes contact with points exterior to the integrated circuit device;
a VSS line;
a VCC line; and
at least one diode for allowing current flow from VSS to VCC, the diode having at least one electrode formed in a generally rectangular shape with a length in the direction of current flow and a width in a direction perpendicular to current flow, the width being more than twice the length, the electrode being at least partly split by at least one divider extending in the direction of the length, whereby current flow in a direction not parallel to the length is inhibited.

The embodiments described above are illustrative only and not limiting. Other embodiments within the scope of the present invention will be apparent to those skilled in the art. The present invention is set forth in the appended claims.

We claim:

1. An output driver circuit comprising:
a plurality of pullup transistors each comprising a source, a drain, and a channel region controlled by a gate, each source, drain, and gate having a length parallel to the direction of current flow and a width perpendicular to the direction of current flow, said width of each region being greater than said length;
said source, drain, and channel regions of said pullup transistors being surrounded by a diffusion region above which are conductive contact regions connected to said diffusion region along at least most of its width, whereby current flow through said pullup transistors during an ESD event is spread over most of the width of said pullup transistors.

2. An output driver circuit as in claim 1 in which said pullup transistors are N-channel transistors.

3. An output driver circuit as in claim 2 further comprising P-channel pullup transistors connected in parallel with said N-channel pullup transistors.

4. An output driver circuit as in claim 1 further comprising:
- a plurality of pulldown transistors each comprising a source, a drain, and a channel region controlled by a gate, each source, drain, and gate having a length parallel to the direction of current flow and a width perpendicular to the direction of current flow, said width of each region being greater than said length;
- said source, drain, and channel regions of said pulldown transistors being surrounded by a diffusion region above which are conductive contact regions connected to said diffusion region along at least most of the width of said diffusion region, whereby current flow through said pulldown transistors during an ESD event is spread over most of the width of said pulldown transistors.

5. An output driver circuit as in claim 1 wherein said length of said source region is substantially 5 µm, said length of said drain region is substantially 3 µm, and said length of said channel region is substantially 1.0 µm.

* * * * *

UNITED STATES PATENT AND TRADEMARK OFFICE
CERTIFICATE OF CORRECTION

PATENT NO. : 5,623,387
DATED : April 22, 1997
INVENTOR(S) : Sheau-Suey Li, Randy T. Ong and Samuel Broydo It is certified that error appears in the above-identified patent and that said Letters Patent is hereby corrected as shown below:

On the Title Page, please delete ; "Khue Duong, San Jose"

Col. 2, line 38, "121b" should read --121b--.

Col. 2, line 42, "121b" should read --121b--.

Col. 2, line 43, "121b" should read --121b--.

Col. 5, line 21, "Voltage" should read --voltage--.

Col. 8, line 9, "11E" should read --10E--.

Col. 15, line 67, "labeled 6B" should read --labeled 8B--.

UNITED STATES PATENT AND TRADEMARK OFFICE
CERTIFICATE OF CORRECTION

PATENT NO.   : 5,623,387
DATED        : April 22, 1997
INVENTOR(S)  : Sheau-Suey Li, Randy T. Ong and Samuel Broydo It is certified that error appears in the above-identified patent and that said Letters Patent is hereby corrected as shown below:

Col. 17, line 4, "labeled 10B" should read --labeled 10D--.

Col. 18, line 12, "Di24" should read --D124--.

Signed and Sealed this

Fifth Day of May, 1998

*Attest:*

BRUCE LEHMAN

*Attesting Officer*     Commissioner of Patents and Trademarks